United States Patent
Hayashi et al.

(10) Patent No.: US 7,880,199 B2
(45) Date of Patent: Feb. 1, 2011

(54) SEMICONDUCTOR DEVICE AND MANUFACTURING METHOD THEREOF

(75) Inventors: Tetsuya Hayashi, Yokosuka (JP);
Masakatsu Hoshi, Yokohama (JP);
Yoshio Shimoida, Yokosuka (JP);
Hideaki Tanaka, Yokohama (JP);
Shigeharu Yamagami, Yokohama (JP)

(73) Assignee: Nissan Motor Co., Ltd., Yokohama-shi (JP)

( * ) Notice: Subject to any disclaimer, the term of this patent is extended or adjusted under 35 U.S.C. 154(b) by 414 days.

(21) Appl. No.: 11/790,791

(22) Filed: Apr. 27, 2007

(65) Prior Publication Data

US 2007/0252173 A1  Nov. 1, 2007

(30) Foreign Application Priority Data

Apr. 28, 2006  (JP) .............................. 2006-125117

(51) Int. Cl.
*H01L 29/66* (2006.01)
(52) U.S. Cl. ................. 257/192; 257/183; 257/E27.014
(58) Field of Classification Search ................. 257/183, 257/192, E27.014, E29.033
See application file for complete search history.

(56) References Cited

U.S. PATENT DOCUMENTS

2004/0079989 A1  4/2004 Kaneko et al.
2004/0217358 A1  11/2004 Kaneko
2005/0062048 A1  3/2005 Hayashi et al.
2006/0118818 A1*  6/2006 Shimoida et al. ............ 257/183

FOREIGN PATENT DOCUMENTS

| EP | 1 519 419 A2 | 3/2005 |
| JP | 2003-318398 A | 11/2003 |
| JP | 2004-253510 A | 9/2004 |

* cited by examiner

*Primary Examiner*—Jerome Jackson, Jr.
*Assistant Examiner*—Dale Page
(74) *Attorney, Agent, or Firm*—Foley & Lardner LLP

(57) ABSTRACT

A semiconductor device is provided with: a semiconductor substrate of a predetermined electroconduction type; a hetero semiconductor region contacted with a first main surface of the semiconductor substrate and comprising a semiconductor material having a bandgap different from that of the semiconductor substrate; a gate electrode formed through a gate insulator layer at a position adjacent to a junction region between the hetero semiconductor region and the semiconductor substrate; a source electrode connected to the hetero semiconductor region; and a drain electrode connected to the semiconductor substrate; wherein the hetero semiconductor region includes a contact portion contacted with the source electrode, at least a partial region of the contact portion is of the same electroconduction type as the electroconduction type of the semiconductor substrate, and the partial region has an impurity concentration higher than an impurity concentration of at least that partial region of a gate-electrode facing portion in the hetero semiconductor region which is positioned to face toward the gate electrode through the gate insulator layer.

15 Claims, 22 Drawing Sheets

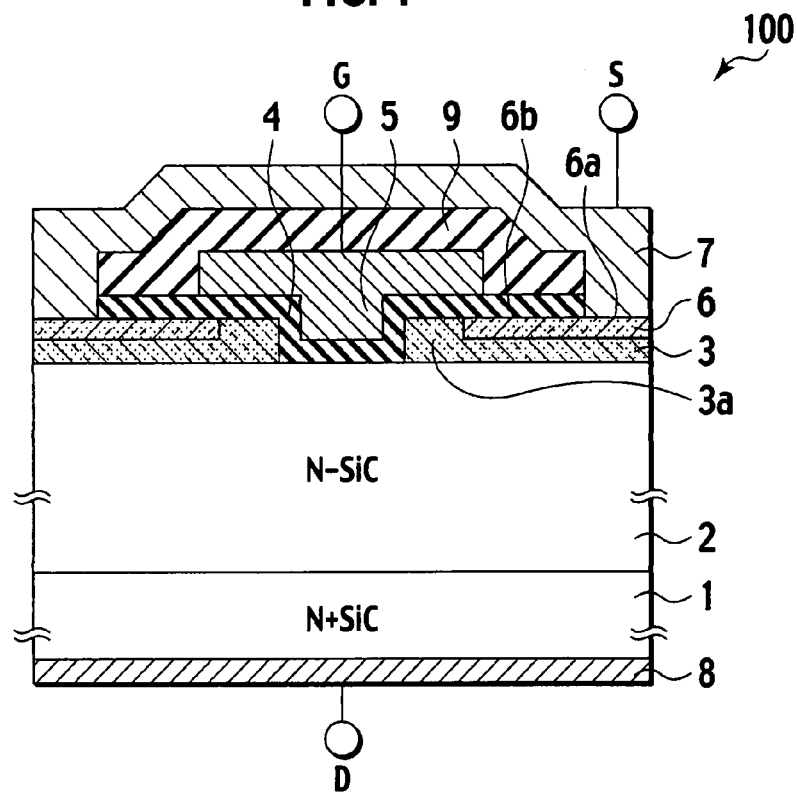
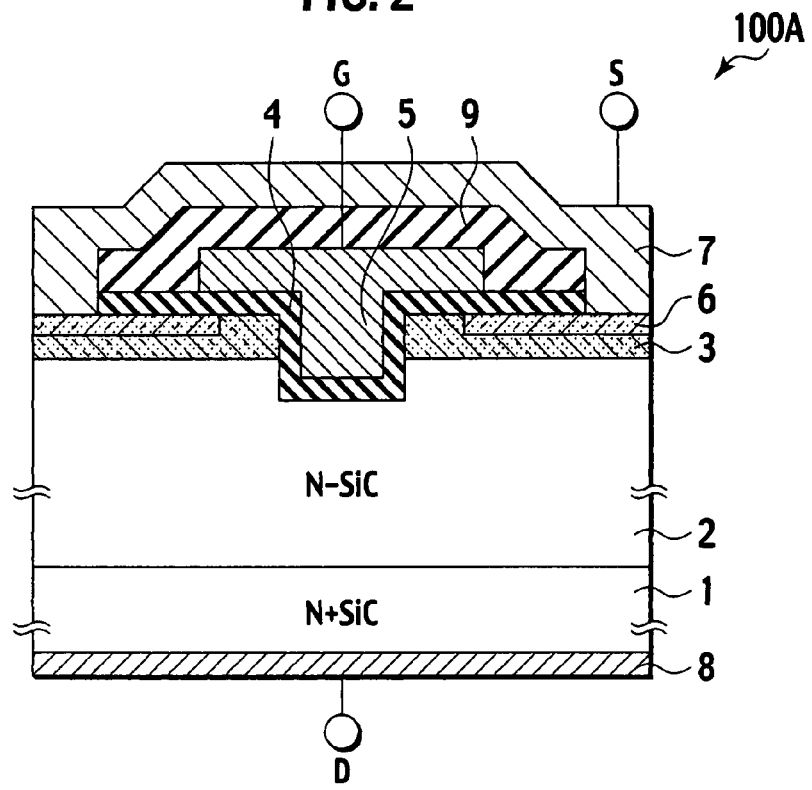

SEMICONDUCTOR DEVICE AND MANUFACTURING METHOD THEREOF

BACKGROUND OF THE INVENTION

1. Field of the Invention

The present invention relates to a semiconductor device and a manufacturing method thereof.

2. Description of the Related Art

The related art as a background of the present invention includes US2004/0217358 A1 corresponding to Japanese Patent Application Laid-Open Publication No. 2003-318398 entitled "Silicon carbide semiconductor device", which was matured from a Japanese patent application No. 2002-125412 filed by the present applicant.

The related art in the publication describes a semiconductor device having a semiconductor substrate including: a silicon carbide substrate region of an $N^+$-type; and an $N^-$-type epitaxial region formed on the substrate region; where the semiconductor device further includes an $N^-$-type polycrystalline silicon region formed to be contacted with a first main surface of the semiconductor substrate in a manner that the epitaxial region and the $N^-$-type polycrystalline silicon layer are connected by heterojunction with each other, so that the $N^-$-type polycrystalline silicon layer acts as a hetero semiconductor region. The semiconductor device further includes a gate electrode formed, via gate insulator layer, near the junction region between the epitaxial region and $N^-$-type polycrystalline silicon region. The $N^-$-type polycrystalline silicon region is connected to a source electrode, and the $N^+$-type silicon carbide substrate region has a reverse surface formed with a drain electrode.

The semiconductor device according to the related art having such a configuration acts as a switch, by controlling an electric potential of the gate electrode in a state that the source electrode is grounded and a predetermined positive voltage is applied to the drain electrode. Namely, a reverse bias is applied to the heterojunction between the $N^-$-type polycrystalline silicon region and the epitaxial region in the state that the gate electrode is grounded, so that no electric current flows between the drain electrode and source electrode. However, in a state that a predetermined positive voltage is applied to the gate electrode, there is generated a gate field acting on the hetero junction interface between the $N^-$-type polycrystalline silicon region and the epitaxial region to decrease a thickness of an energy barrier at the heterojunction plane relative to an interface of a gate oxide film, thereby allowing electric current to flow between the drain electrode and the source electrode.

Note that the related art such as the noted patent publication adopts the heterojunction region as a channel controlling non-conduction and conduction of electric current, so that a channel length is functionally provided substantially at the thickness of the hetero barrier, thereby allowing obtainment of a conduction property of a low resistance.

SUMMARY OF THE INVENTION

However, the conventional structure described in the noted patent publication suffers from a restriction of a decrease of contact resistance at the connection between the $N^-$-type polycrystalline silicon region, i.e., hetero semiconductor region, and the source electrode. Further, the noted patent publication also describes a manufacturing method where impurities are implanted into the polycrystalline silicon layer just after deposition thereof, and there is intermediately conducted a process accompanied by heat treatment during a period between formation of the $N^-$-type polycrystalline silicon region, i.e., hetero semiconductor region, and formation of the source electrode on the hetero semiconductor region. Thus, the impurities implanted into the polycrystalline silicon region, i.e., hetero semiconductor region are diffused to lower an impurity concentration in a predetermined region of the $N^-$-type polycrystalline silicon region, i.e., hetero semiconductor region contacted with the source electrode, thereby also causing a restriction of decrease of a contact resistance of the hetero semiconductor region to the source electrode.

The present invention has been achieved to solve the problems in the related art. It is an object of the present invention to provide a semiconductor device capable of decreasing a contact resistance between a hetero semiconductor region and a source electrode as well as an ON-resistance in the hetero semiconductor region, and a manufacturing method of readily manufacturing the semiconductor device.

To achieve the object, a first aspect of the invention provides a semiconductor device comprising: a semiconductor substrate of a predetermined electroconduction type; a hetero semiconductor region contacted with a first main surface of the semiconductor substrate and comprising a semiconductor material having a bandgap different from that of the semiconductor substrate; a gate electrode formed through a gate insulator layer at a position adjacent to a junction region between the hetero semiconductor region and the semiconductor substrate; a source electrode connected to the hetero semiconductor region; and a drain electrode connected to the semiconductor substrate; wherein the hetero semiconductor region includes a contact portion contacted with the source electrode, at least a partial region of the contact portion is of the same electroconduction type as the electroconduction type of the semiconductor substrate, and the partial region has an impurity concentration higher than an impurity concentration of at least that partial region of a gate-electrode facing portion in the hetero semiconductor region which is positioned to face toward the gate electrode through the gate insulator layer.

According to the first aspect, the hetero semiconductor region includes a contact portion contacted with the source electrode, at least a partial region of the contact portion is of the same electroconduction type as the electroconduction type of the semiconductor substrate, and the partial region has an impurity concentration higher than an impurity concentration of at least that partial region of a gate-electrode facing portion in the hetero semiconductor region which is positioned to face toward the gate electrode through the gate insulator layer, so that the contact resistance of the hetero semiconductor region with the source electrode can be decreased to allow for decrease of an ON-resistance of the semiconductor device.

BRIEF DESCRIPTION OF THE DRAWINGS

Exemplary embodiments of the invention will become more fully apparent from the following description and appended claims, taken in conjunction with the accompanying drawings. Understanding that these drawings depict only exemplary embodiments and are, therefore, not to be considered limiting of the invention's scope, the exemplary embodiments of the invention will be described with additional specificity and detail through use of the accompanying drawings in which:

FIG. 1 is a cross-sectional view of a structure of a semiconductor device according to a first embodiment of the present invention;

FIG. 2 is a cross-sectional view of a structure of a semiconductor device different from that of FIG. 1 according to the first embodiment of the present invention;

DETAILED DESCRIPTION OF THE PREFERRED EMBODIMENTS

Figure 3:
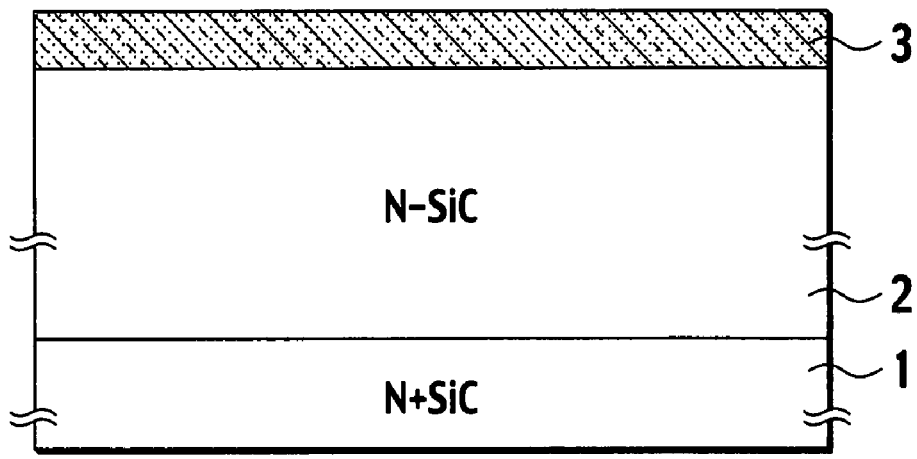
FIG. 3 is a cross-sectional view of an exemplary structure of an intermediate product in a first step of a process of manufacturing the semiconductor device according to the first embodiment of the present invention.

There will be detailed below the preferred embodiments of the present invention with reference to the accompanying drawings. Like members are designated by like reference characters.

First Embodiment

Example of Structure

FIG. 1 is a cross-sectional view of a structure of a semiconductor device 100 according to a first embodiment of the present invention. Although the semiconductor device 100 of FIG. 1 is shown in its cross section where two structural unit cells are juxtaposed with each other, such cells are actually formed plurally in a parallel-connected manner to form the semiconductor device. Note that this embodiment will be explained based on the semiconductor device exemplarily adopting silicon carbide as a substrate material.

The semiconductor device includes: a substrate region 1 exemplarily made of silicon carbide of an N$^+$-type ("+" means a high concentration) exhibiting a 4H (four-hexagonal) type as a polytype (polycrystalline type) of the silicon carbide; and a drain region 2 of an N$^-$-type ("−" means a low concentration) formed on the substrate region 1 to establish a semiconductor substrate. Formed over a predetermined region such as a peripheral region on the first main surface of the drain region 2 opposite to its junction surface to the substrate region 1, is a first hetero semiconductor region 3 (hetero semiconductor region 3 of N-type as a first electroconduction type) made of polycrystalline silicon of the same electroconduction type as the semiconductor substrate such as an N-type, in a manner to contact with the first main surface. Namely, the junction region between the drain region 2 and the first hetero semiconductor region 3 is formed in a heterojunction between a silicon carbide material and a polycrystalline silicon material having bandgaps different from each other, so that an energy barrier is present at the junction interface. The semiconductor device further includes a gate insulator layer 4 exemplarily made of a silicon oxide film in a manner to be contacted with both the first hetero semiconductor region 3 and the drain region 2 without digging a groove into the first main surface of a surface-layer portion of the drain region 2. The semiconductor device further includes a gate electrode 5 formed in a predetermined region of the gate insulator layer 4, such as a central region thereof.

The first hetero semiconductor region 3 of the semiconductor device 100 in FIG. 1 includes therein a low-resistance region 6 of N$^+$-type formed along a first main surface of the hetero semiconductor region, from at least a part of the hetero semiconductor region 3 where the low-resistance region 6 contacts at its end with the source electrode 7, to a position where the low-resistance region 6 is located just below and adjacent to a peripheral portion of the gate electrode 5 through the gate insulator layer 4, so that the low-resistance region 6 is connected to the source electrode 7. Namely, the semiconductor device 100 of FIG. 1 includes a contact portion 6a contacted with the source electrode 7, and an electroconductive portion 6b interposed between the gate-electrode facing portion 3a and the contact portion 6a, such that both portions 6a, 6b formed as the low-resistance region 6 are each configured to be high in impurity concentration (N$^+$-type) as compared with an impurity concentration (N$^-$-type) of the gate-electrode facing portion 3a formed as the part of first hetero semiconductor region 3, i.e., the impurity concentration (N$^-$-type) of the gate-electrode facing portion 3a arranged at a position facing toward and adjacently to the gate electrode 5 through the gate insulator layer 4. The semiconductor device includes a drain electrode 8 formed to be connected to the substrate region 1. The gate electrode 5 and source electrode 7 are insulated from each other by an inter-layer insulator film 9.

In this embodiment, the semiconductor device 100 shown in FIG. 1 has an exemplary structure where the gate electrode 5 is adjacent to both the first hetero semiconductor region 3 and the drain region 2 through the gate insulator layer 4, without digging a groove into the central portion of the first main surface of the drain region 2, i.e., into the surface of the drain region contacted with the gate insulator layer 4. However, it is possible to provide a semiconductor device 100A such as shown in FIG. 2, in a so-called trench configuration including a groove digged into the central portion of the first main surface of the drain region 2 in a manner to bury the gate electrode 5 through the gate insulator layer 4 into the groove digged in the drain region 2. Note that FIG. 2 is a cross-sectional view of a structure of a semiconductor device different from that of FIG. 1, according to the first embodiment of the present invention.

Example of Manufacturing Method

There will be explained a manufacturing method of the semiconductor device 100 according to the first embodiment of the present invention shown in FIG. 1, with reference to FIG. 3 to FIG. 10. FIG. 3 to FIG. 10 are cross-sectional views of exemplary structures of intermediate products in respective steps of a process of manufacturing the semiconductor device 100 according to the first embodiment of the present invention, respectively, and show the exemplary structures of intermediate products in a first step to an eighth step, respectively.

As shown in a cross-sectional view of FIG. 3 in the first step (semiconductor substrate forming step; and a first half of hetero semiconductor region forming step), there is formed a polycrystalline silicon layer exemplarily fabricated by an LP-CVD (Low Pressure Chemical Vapor Deposition) method on an N-type silicon carbide semiconductor substrate which has been formed by epitaxially growing an $N^-$-type drain region 2 on an $N^+$-type substrate region 1. The polycrystalline silicon layer is formed into a precursor layer of a first hetero semiconductor region 3 of $N^-$-type, by implanting impurity like phosphorus or arsenic into the polycrystalline silicon layer by an ion implantation method. Not by the LP-CVD method, the polycrystalline silicon layer may be formed from a silicon layer deposited by an electron beam vapor deposition method or sputtering method followed by recrystallization of the silicon layer by laser annealing, for example, or may be formed from a single crystal silicon which is hetero epitaxially grown by molecular beam epitaxy, for example. Further, without limited to the ion implantation method, it is possible to adopt a solid phase diffusion method or vapor phase diffusion method as a method of doping impurities into the polycrystalline silicon layer.

Figure 4:
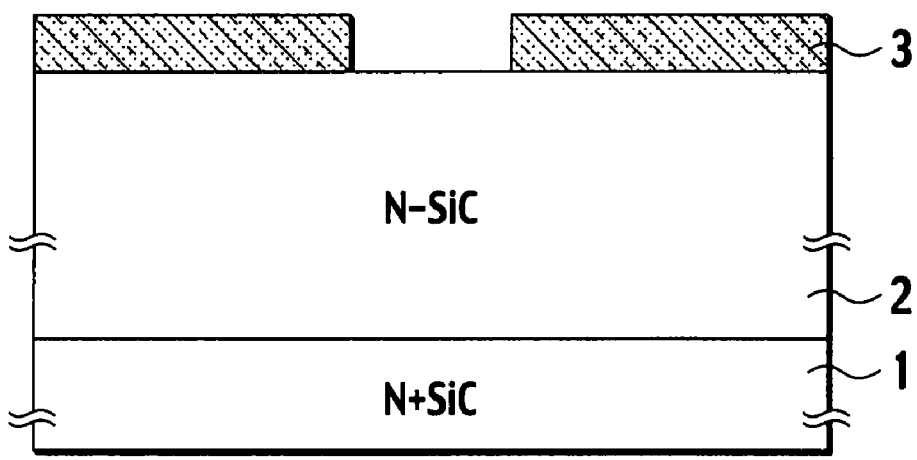
FIG. 4 is a cross-sectional view of an exemplary structure of an intermediate product in a second step of the process of manufacturing the semiconductor device according to the first embodiment of the present invention.

Next, as shown in a cross-sectional view of FIG. 4 in the second step (latter half of hetero semiconductor region forming step), there is formed a predetermined mask material on a predetermined region (peripheral region) of the precursor layer of the first hetero semiconductor region 3 of $N^-$-type exemplarily by photolithography, respectively, and then the precursor layer of the first hetero semiconductor region 3 of $N^-$-type is selectively etched by reactive ion etching (dry etching), thereby forming the first hetero semiconductor region 3 configured with the peripheral region. At this time, it is possible to adopt a different material such as an $SiO_2$ film or SiN film as a mask material. It is further possible to adopt a different etching method such as a wet etching method or an etching method by oxidation and by oxide film removal, as an etching method of the precursor layer of the first hetero semiconductor region 3.

Further, in a state that the mask material is removed after etching of the precursor layer of the first hetero semiconductor region 3, it is possible to achieve removal of an etching damage due to the dry etching, by forming a sacrificial oxide film by dry $O_2$ oxidation at 900° C., for example, and by subsequently removing the sacrificial oxide film by wet etching by a mixed solution of ammonium fluoride and hydrofluoric acid, for example. Although the oxidation by dry $O_2$ is exemplarily referred to as a forming method of a sacrificial oxide film, any method will do that is capable of causing a region of the drain region 2 including an etching damage to be captured in the oxide film. Furthermore, depending on the type of the mask material, it is possible to achieve an etching damage removal step such as the sacrificial oxidation, in a state that the mask material still remains.

Figure 5:
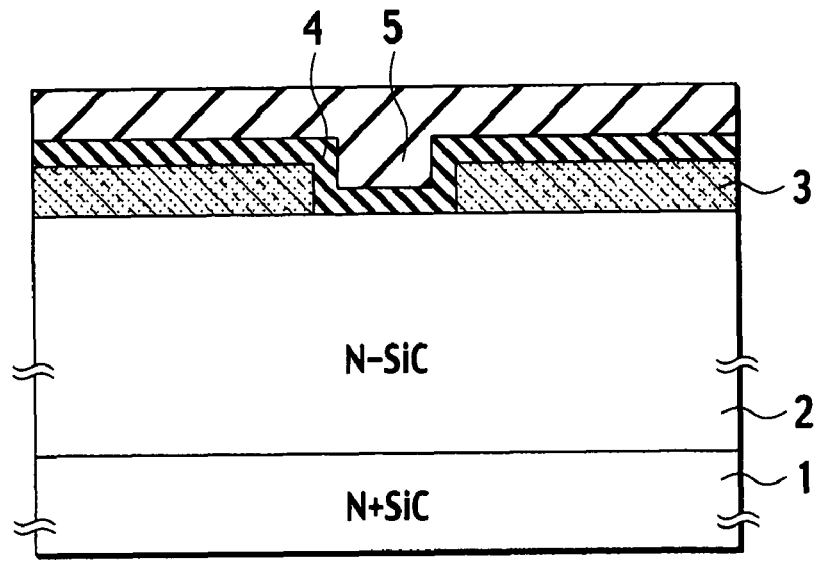
FIG. 5 is a cross-sectional view of an exemplary structure of an intermediate product in a third step of the process of manufacturing the semiconductor device according to the first embodiment of the present invention.

Next, as shown in a cross-sectional view of FIG. 5 in the third step (gate electrode precursor layer forming step), there is formed a gate insulator layer 4 along surface-layer portions of the first hetero semiconductor region 3 and drain region 2. The gate insulator layer 4 may be formed by thermal oxidation, or may be formed by utilizing an oxide film formed by a CVD method. It is also possible to achieve an annealing step at a predetermined temperature or in a predetermined ambient, after forming an oxide film. Turning to the context, there is subsequently deposited a polycrystalline silicon layer formed by an LP-CVD method, for example, as a precursor layer of a gate electrode 5, on the gate insulator layer 4.

Figure 6:
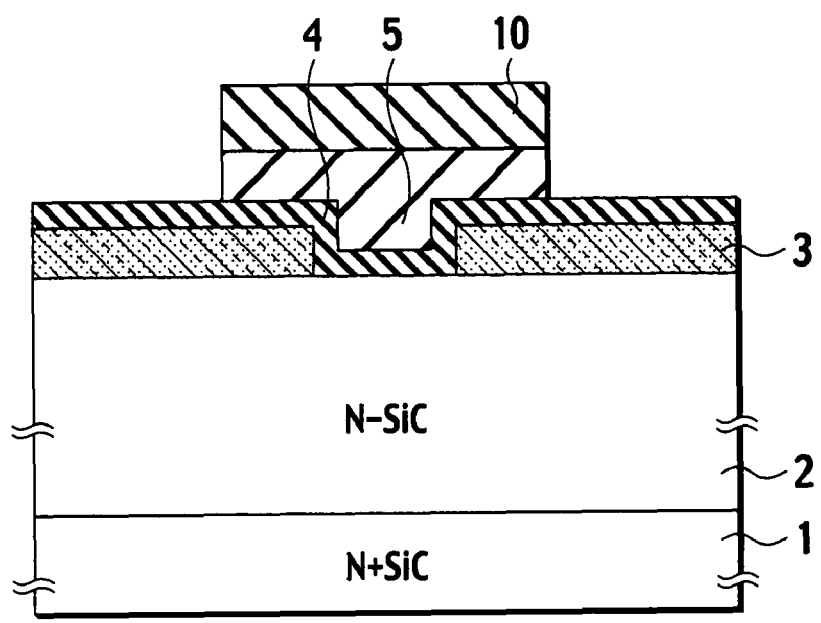
FIG. 6 is a cross-sectional view of an exemplary structure of an intermediate product in a fourth step of the process of manufacturing the semiconductor device according to the first embodiment of the present invention.

Then, as shown in a cross-sectional view of FIG. 6 in the fourth step (gate electrode forming step), there is formed a predetermined mask material 10 exemplarily by photolithography on a predetermined region (central region) of the precursor layer of the gate electrode 5, and the precursor layer of the gate electrode 5 is selectively etched exemplarily by reactive ion etching (dry etching), thereby patterning the precursor layer into the gate electrode 5. At that time, it is possible to adopt a different material such as an $SiO_2$ film or an SiN film as the mask material 10.

Figure 7:
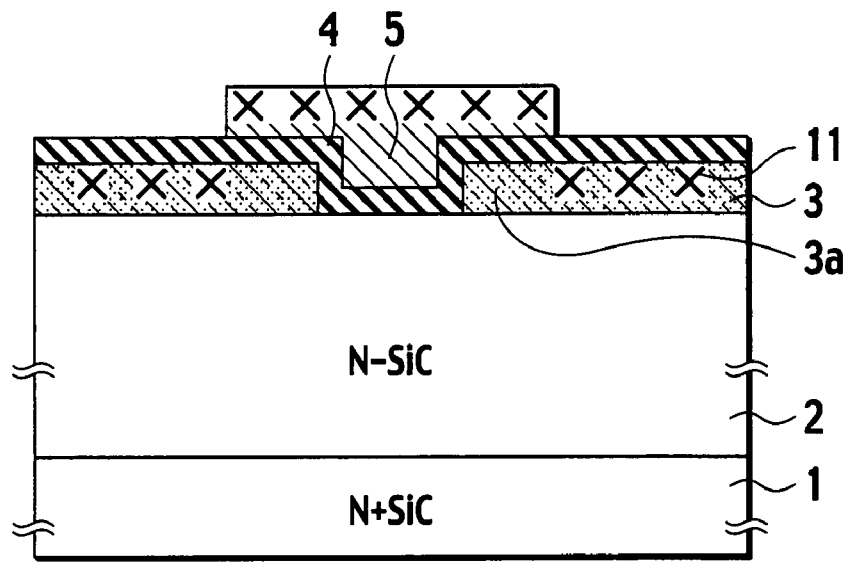
FIG. 7 is a cross-sectional view of an exemplary structure of an intermediate product in a fifth step of the process of manufacturing the semiconductor device according to the first embodiment of the present invention.

Next, as shown in a cross-sectional view of FIG. 7 in the fifth step (low-resistance region forming step and gate electrode layer impurity implanting step), phosphorus or arsenic as impurity is implanted simultaneously into the surface-layer portion of the first hetero semiconductor region 3 and into the gate electrode 5 exemplarily by an ion implantation method, after removing the mask material 10. Although this embodiment is described for a situation that impurities are implanted into the surface-layer portion of the first hetero semiconductor region 3 through the gate insulator layer 4, it is possible to implant impurities after removing predetermined portions of the gate insulator layer 4 contacting with a portion of the first hetero semiconductor region into which the impurities are to be implanted. It is further possible to adopt a solid phase diffusion method or vapor phase diffusion method for implantation of impurities.

Figure 8:
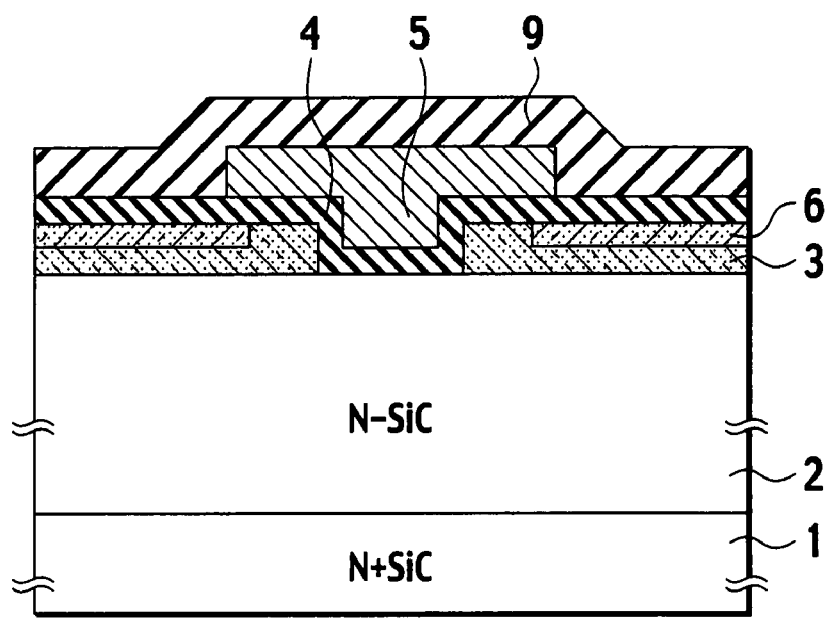
FIG. 8 is a cross-sectional view of an exemplary structure of an intermediate product in a sixth step of the process of manufacturing the semiconductor device according to the first embodiment of the present invention.

Then, as shown in a cross-sectional view of FIG. 8 in the sixth step (inter-layer insulator film forming step), there is formed an inter-layer insulator film 9 made of a silicon oxide film such as formed by a CVD method on the gate insulator layer 4 and gate electrode 5, and the impurities implanted into the surface-layer portion of the first hetero semiconductor region 3 and into the gate electrode 5 at the fifth step of FIG. 7 are activated exemplarily by heat treatment, thereby forming an $N^+$-type low-resistance region 6 and an $N^+$-type gate electrode 5, respectively (the symbol "+" indicates a high concentration). Since it is possible here to readily control a diffusion depth of the low-resistance region 6 by controlling a temperature, time, and the like of the heat treatment, it is possible to form the low-resistance region 6 in a manner to be also positioned just below and adjacent to the periphery of the gate electrode 5 through the gate insulator layer 4.

Figure 9:
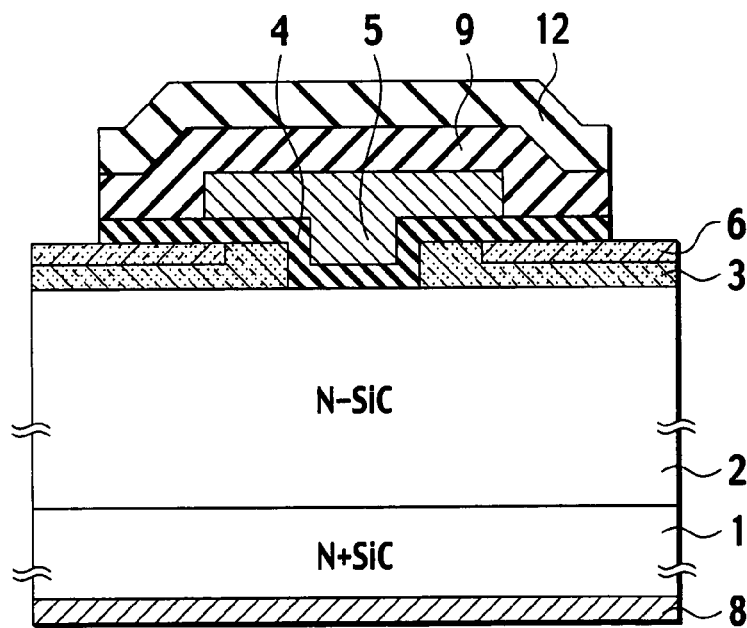
FIG. 9 is a cross-sectional view of an exemplary structure of an intermediate product in a seventh step of the process of manufacturing the semiconductor device according to the first embodiment of the present invention.

Next, as shown in a cross-sectional view of FIG. 9 in the seventh step (drain electrode forming step, and contact hole forming step), the substrate region 1 corresponding to a reverse surface side of the semiconductor device is brought to be formed with a drain electrode 8 such as made of titanium (Ti) or nickel (Ni). Subsequently, there is used a predetermined mask material 12 formed on a predetermined region (except for peripheral region) of the inter-layer insulator film 9, thereby selectively etching peripheral region of the inter-layer insulator film 9 such as by reactive ion etching (dry etching) to open a contact hole.

Figure 10:
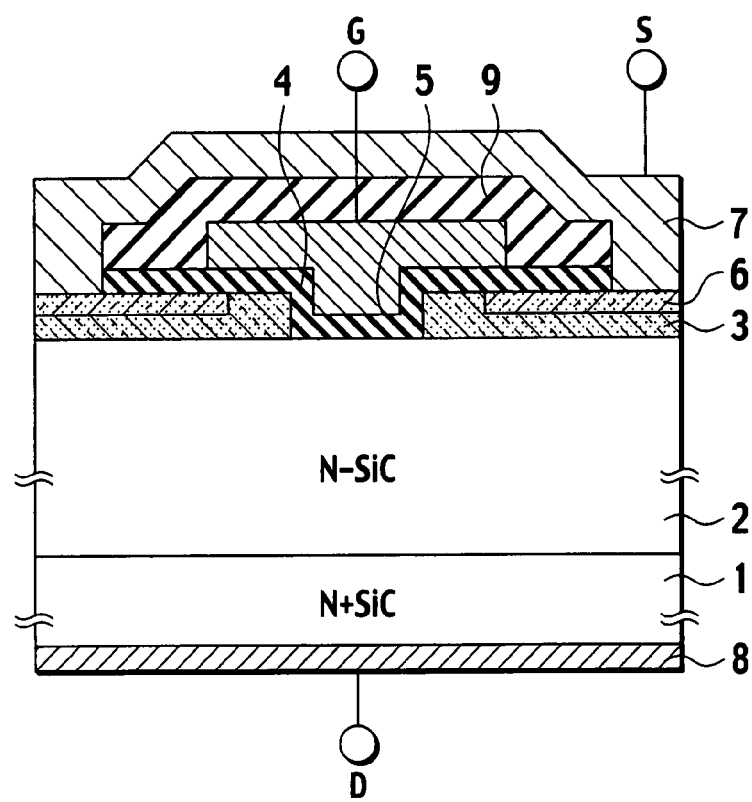
FIG. 10 is a cross-sectional view of an exemplary structure of an intermediate product in an eighth step of the process of manufacturing the semiconductor device according to the first embodiment of the present invention.

Finally, as shown in a cross-sectional view of FIG. 10 in the eighth step (source electrode forming step), the mask material 12 is removed, followed by formation of a source electrode 7 by successively depositing titanium (Ti) and aluminum (Al) in a manner to connect to the low-resistance region 6 via contact hole, thereby completing the semiconductor device 100 according to the first embodiment of the present invention shown in FIG. 1.

As described above, the semiconductor device 100 of this embodiment can be readily produced by the conventional manufacturing techniques.

Further, in this embodiment, the step of implanting impurities into the first hetero semiconductor region 3 and gate electrode 5 shown in the fifth step of FIG. 7 is arranged in an order at least after the fourth step of FIG. 6 of using the predetermined mask material 10 to pattern the gate electrode 5, thereby allowing for formation of the low-resistance region 6 without affected by heat treatments to be performed upon, before, or after formation of the gate insulator layer 4, to enable an impurity concentration, thickness, and the like of the low-resistance region 6 to be controlled very easily. Particularly, when polycrystalline silicon is adopted as the first hetero semiconductor region 3 such as in this embodiment, diffusion of impurities is made fast as compared with single crystal silicon such that exposure of the polycrystalline silicon to a thermal process improving a quality of the gate insulator layer 4 can be avoided, thereby resultingly and remarkably improving the controllability of formation of the low-resistance region 6.

As described above, formation of the low-resistance region 6 in the first hetero semiconductor region 3 enables a contact resistance thereof with the source electrode 7 to be further decreased. Further, the low-resistance region 6 in this embodiment is formed at a predetermined thickness exemplarily in the surface-layer portion of the first hetero semiconductor region 3, in a manner that the first hetero semiconductor region 3 is formed under the low-resistance region 6 in an area to be contacted with the drain region 2 (i.e., in an area to be connected by heterojunction therewith), thereby enabling obtainment of a withstand voltage to be determined by the heterojunction between the drain region 2 and first hetero semiconductor region 3.

Further, upon implantation of impurities into the first hetero semiconductor region 3 in this embodiment as shown in the fifth step of FIG. 7, impurities are selectively implanted into a predetermined region such as a peripheral region of the first hetero semiconductor region 3 by utilizing the gate electrode 5, so that no impurities are implanted into a gate-electrode facing portion 3a arranged at a position facing toward and adjacently to the gate electrode 5. This allows the gate-electrode facing portion 3a configured to act as a channel portion to have the same switching characteristic as that of a conventional structure, while the source electrode 7 and gate-electrode facing portion 3a are connected to each other at a low resistance by virtue of the low-resistance region 6 configured with the contact portion 6a and electroconductive portion 6b, thereby enabling an ON-resistance to be further decreased as compared with the conventional structure.

Further, upon implantation of impurities into the first hetero semiconductor region 3 in this embodiment as shown in the fifth step of FIG. 7, impurities are simultaneously implanted into the gate electrode 5 to establish it into an $N^+$-type one, thereby enabling simplification of the $N^+$-type impurity implanting step to enable a restricted manufacturing cost.

Note that the semiconductor device 100 of FIG. 1 has been configured in such an exemplary manner that the contact portion of the low-resistance region 6 connected to the source electrode 7 is parallelized to the first main surface of the semiconductor substrate at the drain region 2 side opposite to the surface-layer portion of the first hetero semiconductor region 3. However, it is also possible that the contact hole connecting the low-resistance region 6 to the source electrode 7 is formed deeply to a position reaching the drain region 2 through the low-resistance region 6, i.e., through the first hetero semiconductor region 3, and the end portion, i.e., side portion (that side which is not parallel to the first main surface of the semiconductor substrate) of the low-resistance region 6 is formed to contact with the source electrode 7. Namely, in this situation, the low-resistance region 6 formed in the first hetero semiconductor region 3 is configured to contact with the source electrode 7, at that surface of the low-resistance region 6 which is not parallel to the first main surface of the drain region 2 of the semiconductor substrate.

Example of Operation

The semiconductor device 100 shown in FIG. 1 will be now explained for an example of operation. This embodiment is used by exemplarily grounding the source electrode 7 and applying a positive potential to the drain electrode 8.

Firstly, when the gate electrode 5 is exemplarily held at a ground potential or negative potential, the semiconductor device 100 keeps a non-conduction state. The reason thereof is that an energy barrier against conduction electrons is formed at the heterojunction interface between the first hetero semiconductor region 3 and the drain region 2.

This embodiment is provided by the above manufacturing method enabling a situation where the low-resistance region 6 is formed into a predetermined thickness, and the first hetero semiconductor region 3 is formed in that region under the low-resistance region 6 which contacts with the drain region 2. This enables obtainment of a withstand voltage to be determined by the hetero junction between the drain region 2 and first hetero semiconductor region 3.

Next, when a positive potential is applied to the gate electrode 5 so as to turn the non-conduction state into a conduction state, the gate field spreads through the gate insulator layer 4 and up to the heterojunction interface where the first hetero semiconductor region 3 contacts with the drain region 2, thereby forming storage layers of conduction electrons at the surface-layer portion of the gate-electrode facing portion 3a of the first hetero semiconductor region 3 and the surface-layer portion of the drain region 2, adjacently to the gate electrode 5. This resultingly pushes down the potential at the first hetero semiconductor region 3 side at the junction interface between the first hetero semiconductor region 3 and the drain region 2 adjacent to the gate electrode 5, and steepens the energy barrier at the drain region 2 side, thereby enabling conduction electrons to be conducted through the energy barrier.

At this time, upon implantation of impurities into the first hetero semiconductor region 3 in this embodiment as described above, impurities are selectively implanted into the peripheral region of the first hetero semiconductor region 3 by utilizing the gate electrode 5, so that no impurities are implanted into the gate-electrode facing portion 3a at the central portion of the first hetero semiconductor region 3 facing toward the gate electrode 5, thereby establishing a structure where the gate field is scarcely shielded. This enables the energy barrier at the drain region 2 side to be more steepened, thereby enabling obtainment of a higher conduction performance. Further, the portion, through which the gate-electrode facing portion 3a is connected to the source electrode 7, can be established by the low-resistance region 6 at a low resistance as compared with the conventional structure, and the contact resistance to the source electrode 7 can also be decreased, thereby enabling the ON-resistance to be further decreased.

Next, the gate electrode 5 is again brought to a ground potential so as to turn the semiconductor device from the conduction state into the non-conduction state, so that the storage state of conduction electrons stored at the heterojunction interface between the first hetero semiconductor region 3 and drain region 2 is released, thereby stopping tunneling of conduction electrons through the energy barrier. Thereafter, flow of conduction electrons from the first hetero semiconductor region 3 into the drain region 2 is stopped, and conduction electrons included in the drain region 2 subsequently flow out into the substrate region 1 and are thus depleted, upon which a depletion layer is spread from the heterojunction region with the first hetero semiconductor region 3 into the drain region 2 side, thereby bringing about the non-conduction state.

In this embodiment, it is also possible to exemplarily ground the source electrode 7 and apply a negative potential to the drain electrode 8, thereby achieving a reverse conduction (backflow operation).

For example, when the source electrode 7 and gate electrode 5 are each kept at a ground potential and a predetermined negative voltage is applied to the drain electrode 8, the energy barrier against conduction electrons disappears, so that conduction electrons flow from the drain region 2 side into the first hetero semiconductor region 3 side, thereby achieving a reverse conduction state. At this time, conduction is attained only by conduction electrons without injection of positive holes, thereby also decreasing a loss due to a reverse recovery current upon transition from the reverse conduction state into anon-conduction state. Note that it is also possible to use the gate electrode 5 as a control electrode applying a control voltage, instead of grounding the gate electrode 5.

While the semiconductor device 100 of FIG. 1 has been exemplarily described about the features of this embodiment, it is also possible to fully identically realize the features even in such a structure of the semiconductor device 100A of FIG. 2, and such structures of a semiconductor device 100B of FIG. 11, a semiconductor device 100C of FIG. 17, and a semiconductor device 100D of FIG. 21 to be described later.

As explained above in detail, at least that applicable part of the first hetero semiconductor region 3 which extends from the vicinity of the gate-electrode facing portion 3a facing toward the peripheral portion of the gate electrode 5 up to the contact portion of the first hetero semiconductor region 3 connected to the source electrode 7, is increased in impurity concentration as compared with at least a partial region of the gate-electrode facing portion 3a, so that the applicable part acting as the low-resistance region 6 can be decreased in resistance and the contact resistance to the source electrode 7 can also be decreased, thereby enabling decrease of ON-resistances of the semiconductor devices 100 and 100A, respectively.

Concerning the manufacturing method, impurities are implanted into the first hetero semiconductor region 3 at least after the patterning step of the gate electrode 5 to thereby form the low-resistance region 6, thereby enabling formation of the low-resistance region 6 without affected by heat treatments to be performed before and after formation of the gate insulator layer 4, to enable an impurity concentration, thickness, and the like of the low-resistance region 6 to be controlled very easily. This further enables the contact resistance to the source electrode 7 to be assuredly decreased.

(Different Structural Example of Semiconductor Device in First Embodiment)

Figure 11:
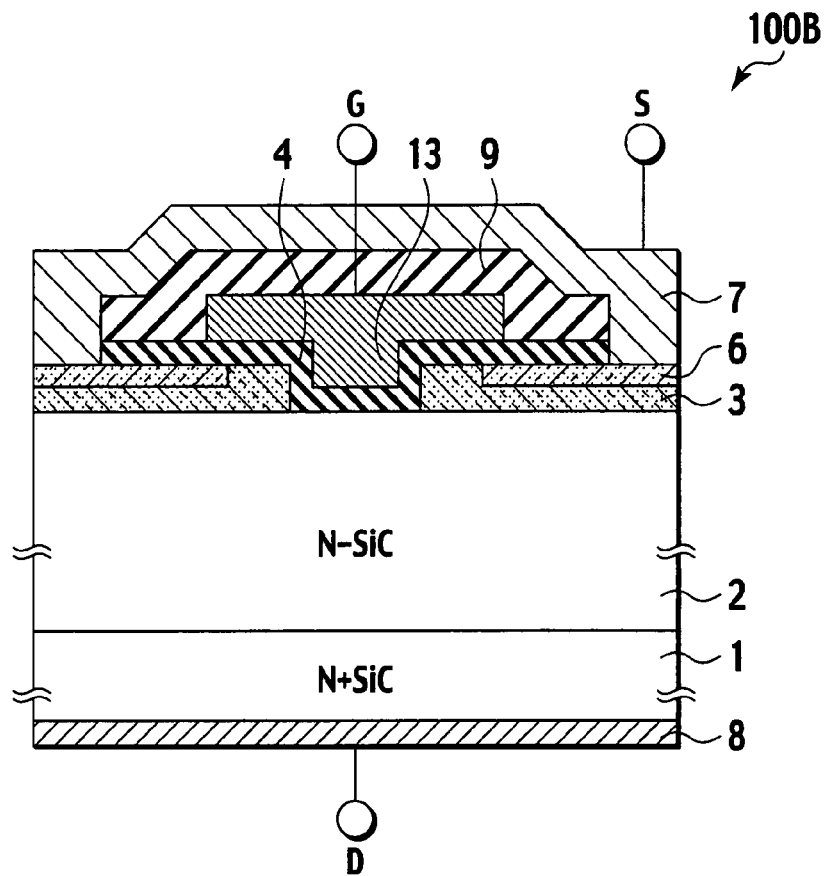
FIG. 11 is a cross-sectional view of a structure of a semiconductor device different from that of FIG. 1 according to the first embodiment of the present invention.

FIG. 11 is a cross-sectional view of a structure of a semiconductor device further different from those of FIG. 1 and FIG. 2, according to the first embodiment of the present invention. The semiconductor device 100B of FIG. 11 is different from the semiconductor device 100 of FIG. 1 in electroconduction type of gate electrode, such that the gate electrode 5 of the semiconductor device 100 has been exemplified as an $N^+$-type, i.e., the first electroconduction type, and the semiconductor device 100B of FIG. 11 is exemplified in a situation that it includes a gate electrode 13 of a $P^+$-type as a second electroconduction type.

(Example of Manufacturing Method)

There will be explained a manufacturing method of the semiconductor device 100B shown in FIG. 11 having the further different structure according to the first embodiment of the present invention, with reference to FIG. 12 to FIG. 16. Here, FIG. 12 to FIG. 16 are cross-sectional views of exemplary structures of intermediate products in respective steps of a process of manufacturing the semiconductor device 100B which is further different from FIG. 1 according to the first embodiment of the present invention, and show the exemplary structures of intermediate products in a fourth step to an eighth step, respectively, subsequent to the applicable midway step of the manufacturing method of the semiconductor device 100, for example.

Figure 12:
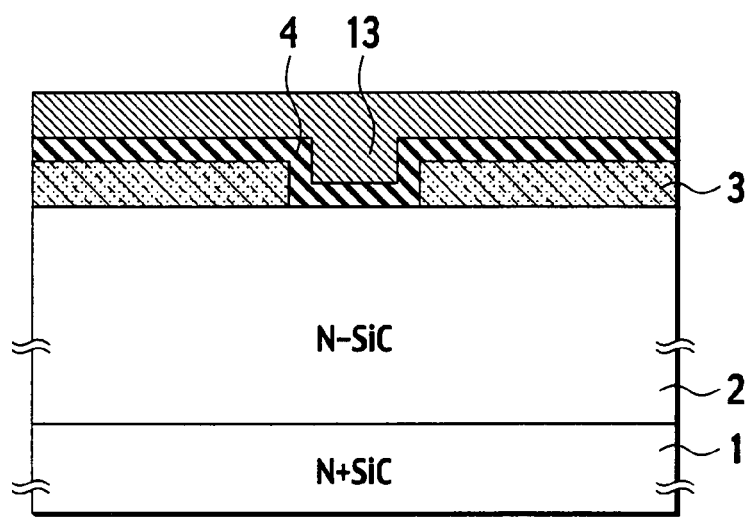
FIG. 12 is a cross-sectional view of an exemplary structure of an intermediate product in a fourth step of a process of manufacturing the semiconductor device different from that of FIG. 1 according to the first embodiment of the present invention.

Namely, the same steps such as those in FIG. 3 to FIG. 5 for the semiconductor device 100 of FIG. 1 are adopted as a first step to a third step for this semiconductor device up to deposition of a polycrystalline silicon layer to be matured into a gate electrode on the gate insulator layer 4 formed at the surface-layer portions of the first hetero semiconductor region 3 and drain region 2, and then the process for this semiconductor device is progressed to the fourth step of FIG. 12.

Firstly, as shown in a cross-sectional view in the fourth step (gate electrode layer impurity implanting step) of FIG. 12, boron is implanted into the polycrystalline silicon layer deposited on the gate insulator layer 4 by a method such as an ion implantation method, solid phase diffusion method, vapor phase diffusion method, or the like, thereby forming a precursor layer of a $P^+$-type gate electrode 13.

Figure 13:
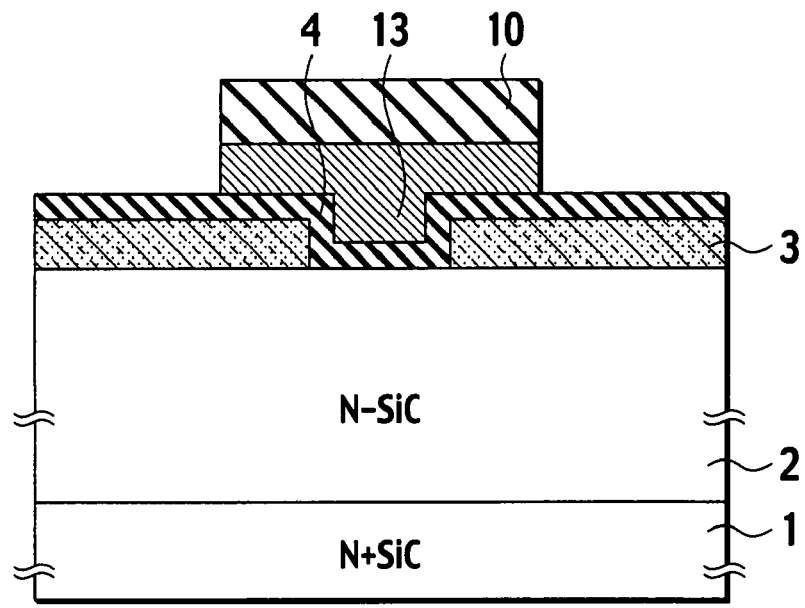
FIG. 13 is a cross-sectional view of an exemplary structure of an intermediate product in a fifth step of a process of manufacturing the semiconductor device different from that of FIG. 1 according to the first embodiment of the present invention.

Next, as shown in a cross-sectional view in the fifth step (gate electrode forming step) of FIG. 13, and similarly to the fourth step of FIG. 6, there is formed a predetermined mask material 10 exemplarily by photolithography on a predetermined region (central region) of the precursor layer of the gate electrode 13, and the precursor layer of the gate electrode 13 is selectively etched exemplarily by reactive ion etching (dry etching), thereby patterning the precursor layer into the gate electrode 13. At that time, it is possible to adopt a different material such as an $SiO_2$ film or an SiN film as the mask material 10.

Figure 14:
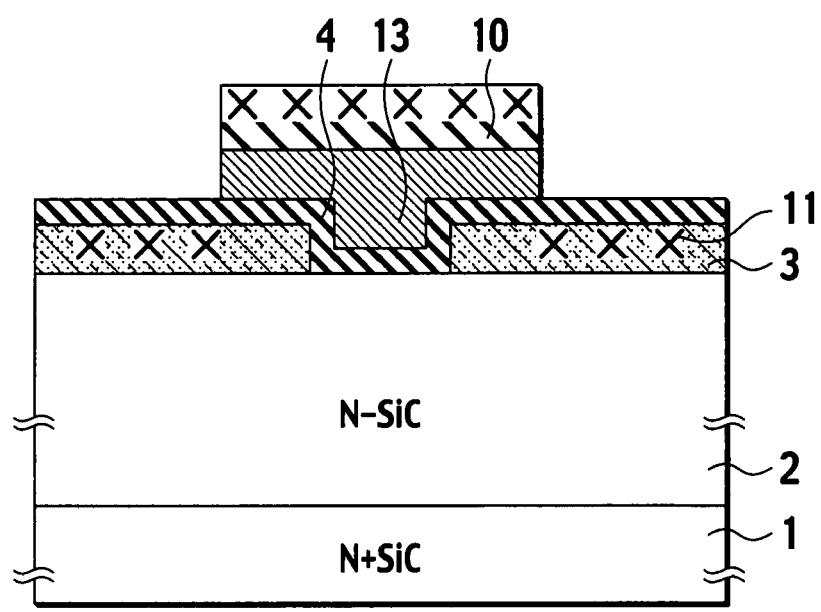
FIG. 14 is a cross-sectional view of an exemplary structure of an intermediate product in a sixth step of a process of manufacturing the semiconductor device different from that of FIG. 1 according to the first embodiment of the present invention.

Then, as shown in a cross-sectional view in the sixth step (low-resistance region forming step) of FIG. 14, and unlike the fifth step of FIG. 7, phosphorus or arsenic as impurity is implanted into a surface-layer portion of the first hetero semiconductor region 3 exemplarily by an ion implantation method, in a state that the mask material 10 is unremoved. At this time in this example and unlike the fifth step of FIG. 7, the mask material 10 is present on the gate electrode 13, so that no impurities reach the gate electrode 13. This example is explained for a situation that impurities are implanted into the surface-layer portion of the first hetero semiconductor region 3 through the gate insulator layer 4. However, similarly to the modification suggested for the fifth step of FIG. 7, it is possible to implant impurities after removing predetermined portions of the gate insulator layer 4 contacting with a portion of the first hetero semiconductor region into which the impurities are to be implanted. It is further possible to adopt a solid phase diffusion method or vapor phase diffusion method for implantation of impurities.

Figure 15:
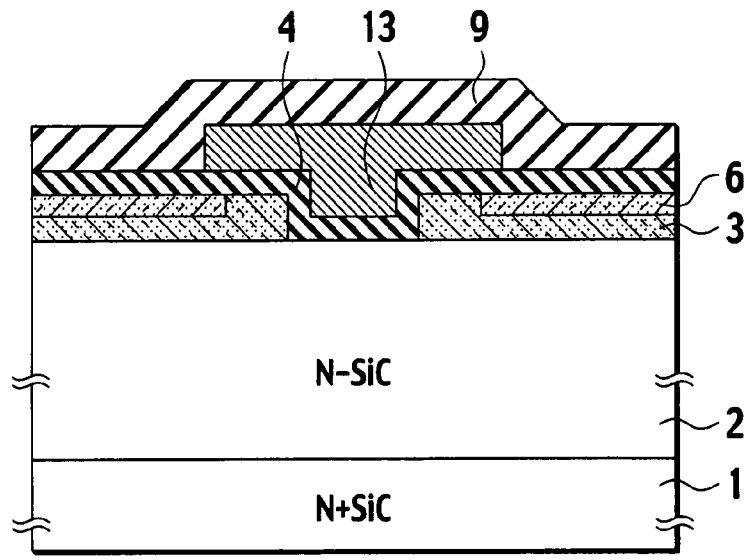
FIG. 15 is a cross-sectional view of an exemplary structure of an intermediate product in a seventh step of a process of manufacturing the semiconductor device different from that of FIG. 1 according to the first embodiment of the present invention.

Next, as shown in a cross-sectional view of FIG. 15 in the seventh step (inter-layer insulator film forming step), there is formed an inter-layer insulator film 9 made of a silicon oxide film such as formed by a CVD method on the gate insulator layer 4 and gate electrode 13 after removing the mask material 10, and the impurities implanted into the surface-layer portion of the first hetero semiconductor region 3 in the sixth step of FIG. 14 are activated exemplarily by heat treatment, thereby forming an $N^+$-type low-resistance region 6. Similarly to the sixth step of FIG. 8, since it is possible here to readily control a diffusion depth of the low-resistance region 6 by controlling a temperature, time, and the like of the heat treatment, it is possible to form the low-resistance region 6 in a manner to be also positioned just below and adjacent to the periphery of the gate electrode 13 through the gate insulator layer 4.

Figure 16:
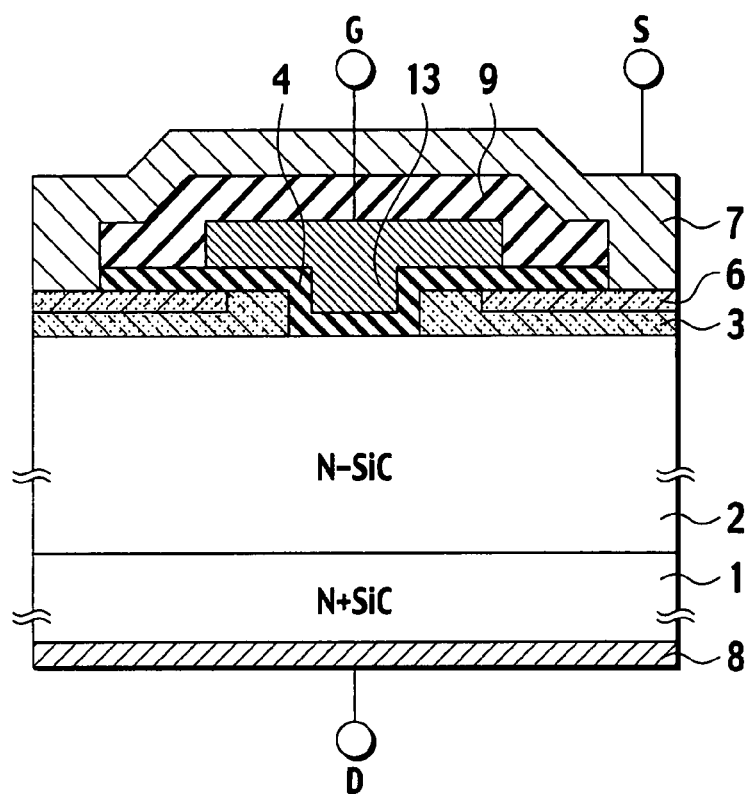
FIG. 16 is a cross-sectional view of an exemplary structure of an intermediate product in an eighth step of a process of manufacturing the semiconductor device different from that of FIG. 1 according to the first embodiment of the present invention.

Finally, as shown in a cross-sectional view in the eighth step of FIG. 16 (drain electrode forming step, contact hole forming step, and source electrode forming step) and similarly to the seventh step of FIG. 9, the substrate region 1 corresponding to a reverse surface side of the semiconductor device is brought to be formed with a drain electrode 8 such as made of titanium (Ti) or nickel (Ni). Subsequently, there is used a predetermined mask material formed on a predetermined region (except for peripheral region) of the inter-layer insulator film 9, thereby selectively etching a predetermined etching region (peripheral region) of the inter-layer insulator film 9 such as by reactive ion etching (dry etching) to open a contact hole. Thereafter, and similarly to the eighth step of FIG. 10, the mask material formed on the inter-layer insulator film 9 is removed, followed by formation of a source electrode 7 by successively depositing titanium (Ti) and aluminum (Al) in a manner to connect to the low-resistance region 6 via contact hole, thereby completing the further different semiconductor device 100B according to the first embodiment of the present invention shown in FIG. 11.

As described above, the configuration of the semiconductor device 100B of this embodiment can also be readily realized by the conventional manufacturing techniques, by adopting the manufacturing method of the present invention shown in FIG. 12 to FIG. 16.

According to the configuration of the semiconductor device 100B of FIG. 11, it is possible in this example to keep a higher certainty of non-conduction state, in addition to the effects obtainable by the structure of semiconductor device 100 shown in FIG. 1. Namely, when the gate electrode 13 is kept at a ground potential, for example, the work function difference between the $P^+$-type gate electrode 13 and the drain region 2 is increased by an amount of bandgap of silicon as compared with the work function difference between the $N^+$-type gate electrode 5 and the drain region 2 in FIG. 1, thereby further strengthening a built-in field spread into the drain region 2 side. This further limits a drain field spreading over the heterojunction region adjacent to the gate electrode 13, thereby enabling further decrease of a leakage current particularly caused at a peripheral portion of the first hetero semiconductor region 3 adjacent to the gate electrode 13.

(Example of Structure of Further Different Semiconductor Device in First Embodiment)

Concerning FIG. 1 to FIG. 16, the configuration examples have been explained where the low-resistance region 6 formed in the surface-layer portion of the first hetero semiconductor region 3 extends from just below the peripheral portion of the gate electrode 5 (or gate electrode 13) through the gate insulator layer 4 up to just below the source electrode 7. However, it is also possible to readily form a structure configured to decrease only a contact resistance to the source electrode 7 as shown in FIG. 17, by virtue of the manufacturing method of the present invention.

Figure 17:
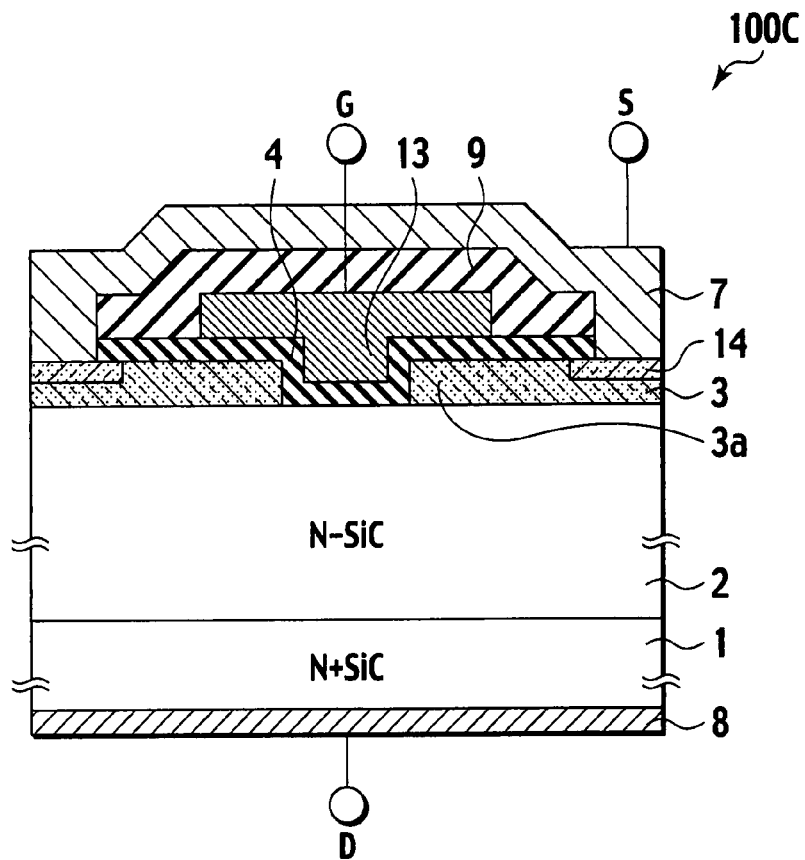
FIG. 17 is a cross-sectional view of a structure of a semiconductor device different from that of FIG. 11 according to the first embodiment of the present invention.

FIG. 17 is a cross-sectional view of a structure of a semiconductor device different from that of FIG. 11 according to the first embodiment of the present invention and further different from that of FIG. 1 according to the first embodiment of the present invention.

The semiconductor device 100C of FIG. 17 is different from the semiconductor device 100B of FIG. 11 and the semiconductor device 100 of FIG. 1, in terms of a formed area of low-resistance region in the first hetero semiconductor region 3. Namely, while the semiconductor device 100B of FIG. 11 and the semiconductor device 100 of FIG. 1 have been each exemplified for a situation that the low-resistance region 6 is formed in the surface-layer portion of the first hetero semiconductor region 3 from just below the peripheral portion of the gate electrode 5 (or gate electrode 13) up to just below the source electrode 7, the semiconductor device 100C of FIG. 17 is exemplified for a situation that an $N^+$-type contact region 14 is formed in at least that surface-layer portion of the first hetero semiconductor region 3 which partially contacts with the source electrode 7. Note that although the semiconductor device 100C of FIG. 17 exemplarily presents a $P^+$-type as the electroconduction type of the gate electrode 13 similarly to the semiconductor device 100B of FIG. 11, it is also possible to adopt such an $N^+$-type gate electrode corresponding to that of FIG. 1.

(Example of Manufacturing Method)

There will be explained a manufacturing method of the semiconductor device 100C having the further different structure according to the first embodiment of the present invention, with reference to FIG. 18 to FIG. 20. Here, FIG. 18 to FIG. 20 are cross-sectional views of exemplary structures of intermediate products in respective steps of a process of manufacturing the semiconductor device 100C according to the first embodiment of the present invention which is further different from FIG. 11, and show the exemplary structures of intermediate products in a sixth step to an eighth step, respectively, subsequent to the applicable midway step of the manufacturing method of the semiconductor device 100B, for example.

Figure 18:
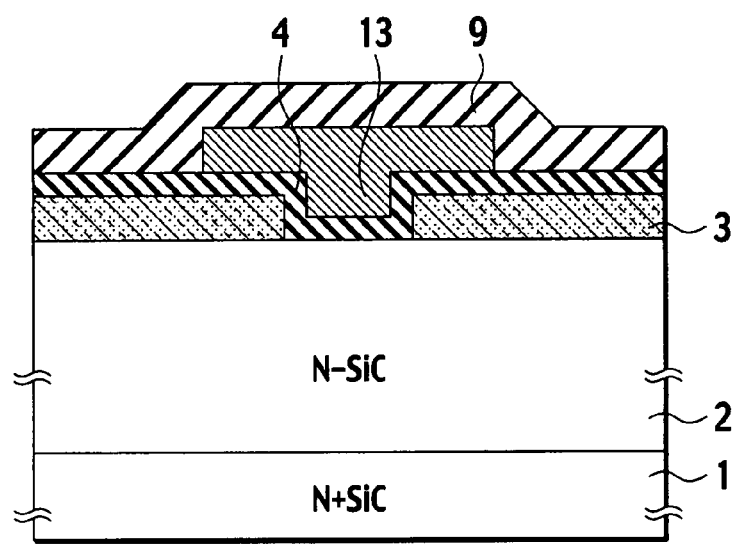
FIG. 18 is a cross-sectional view of an exemplary structure of an intermediate product in a sixth step of a process of manufacturing the semiconductor device different from that of FIG. 11 according to the first embodiment of the present invention.

Namely, the same steps such as those up to the fifth step (gate electrode forming step) of FIG. 13 for the semiconductor device 100 of FIG. 11 are adopted as a first step to a fifth step for this semiconductor device up to selective etching of a precursor layer of a gate electrode 13 to pattern the layer into the gate electrode 13, and then the process for this semiconductor device is progressed to the sixth step of FIG. 18. In case that the substrate region 1 is brought into the same electroconduction type as that of a semiconductor substrate similarly to the semiconductor device 100 of FIG. 1, the process of this embodiment is progressed to the sixth step (which is regarded as a fifth step in this case) of FIG. 18 after carrying out the same steps as those up to the fourth step of FIG. 6 in the first embodiment.

Firstly, a shown in a cross-sectional view in the sixth step (inter-layer insulator film forming step) of FIG. 18, there is formed an inter-layer insulator film 9 made of a silicon oxide film exemplarily formed by a CVD method on the gate insulator layer 4 and gate electrode 13, after removing the mask material 10 formed on the predetermined region (central region) of the gate electrode 13 in the step of FIG. 13, for example.

Figure 19:
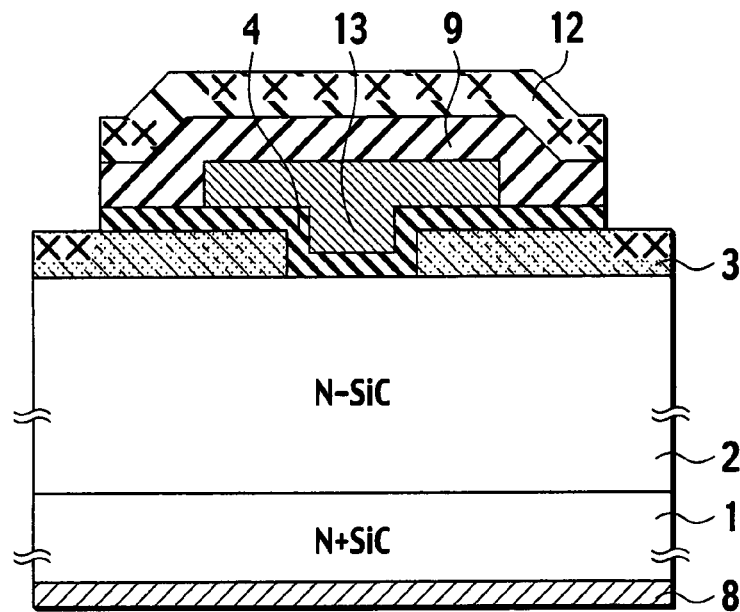
FIG. 19 is a cross-sectional view of an exemplary structure of an intermediate product in a seventh step of a process of manufacturing the semiconductor device different from that of FIG. 11 according to the first embodiment of the present invention.
Figure 20:
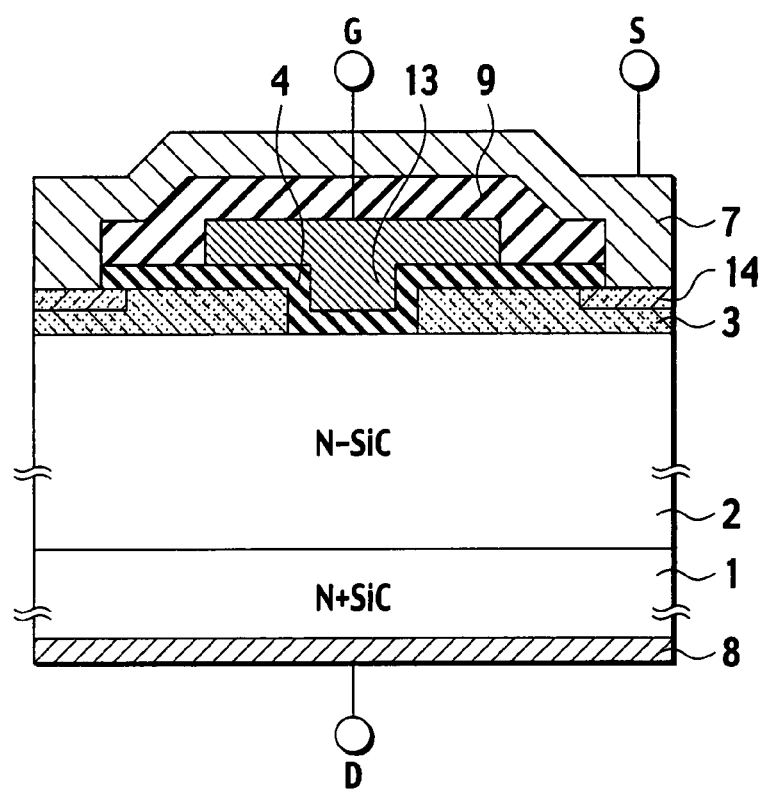
FIG. 20 is a cross-sectional view of an exemplary structure of an intermediate product in an eighth step of a process of manufacturing the semiconductor device different from that of FIG. 11 according to the first embodiment of the present invention.

Next, as shown in a cross-sectional view in the seventh step (drain electrode forming step, contact hole forming step, and contact region forming step) of FIG. 19, the substrate region 1 corresponding to a reverse surface side of the semiconductor device is brought to be formed with a drain electrode 8 such as made of titanium (Ti) or nickel (Ni). Subsequently, there is used a predetermined mask material 12 formed on a predetermined region (except for peripheral region) of the inter-layer insulator film 9, thereby selectively etching predetermined etching regions (peripheral regions) of the inter-layer insulator film 9 and gate insulator layer 4 such as by reactive ion etching (dry etching) to open a contact hole.

Thereafter, phosphorus or arsenic as impurity is implanted into the surface-layer portion exemplarily by an ion implantation method, in a state that the mask material 12 is unremoved. At this time, no impurities reach the inter-layer insulator film 9, because the mask material 12 is still present on the inter-layer insulator film 9 in this example. Further, although this example is described for a situation that impurities are directly implanted into the surface-layer portion of the first hetero semiconductor region 3, it is possible to implant impurities through the gate insulator layer 4 or inter-layer insulator film 9. It is also possible to adopt a solid phase diffusion method or vapor phase diffusion method for implantation of impurities.

Next, as shown in a cross-sectional view in the eighth step (source electrode forming step) of FIG. 20, and after removing the mask material 12, there is performed a predetermined heat treatment activating the impurities implanted in the seventh step of FIG. 19, thereby forming a contact region 14. Further, there is formed a source electrode 7 by successively depositing titanium (Ti) and aluminum (Al) in a manner to connect to the contact region 14 via contact hole, thereby completing the semiconductor device 100C different from that of FIG. 11 according to the first embodiment of the present invention.

Although this example of manufacturing the semiconductor device 100C of FIG. 17 adopts the manufacturing method partially different from those of the semiconductor device 100 of FIG. 1 and the semiconductor device 100B of FIG. 11, it is possible in the eighth step of FIG. 20 to form the contact region 14 over the peripheral portion of the hetero semiconductor region to be contacted with the source electrode 7 without affection by the heat treatments to be performed upon, before, or after formation of the gate insulator layer 4, thereby remarkably facilitating control of an impurity concentration, a thickness, and the like of the contact region 14. Particularly, when polycrystalline silicon is adopted as the first hetero semiconductor region 3 such as in this example, diffusion of impurities is made fast as compared with single crystal silicon such that exposure of the polycrystalline silicon to a thermal process improving a quality of the gate insulator layer 4 can be avoided, thereby resultingly and remarkably improving the controllability of formation of the contact region 14.

As described above, formation of the contact region 14 in the first hetero semiconductor region 3 enables the contact resistance thereof with the source electrode 7 to be further decreased. Further, in this example, the contact region 14 having a predetermined thickness is exemplarily formed in the surface-layer portion of the first hetero semiconductor region 3, and the region under the contact region contacting with the drain region 2 side is provided by formation of the first hetero semiconductor region 3, thereby enabling obtainment of a withstand voltage to be determined by the heterojunction between the drain region 2 and first hetero semiconductor region 3.

In this embodiment described with reference to FIG. 1 to FIG. 20, the situations have been explained where the low-resistance region 6 or contact region 14 is formed only in the surface-layer portion of the first hetero semiconductor region 3. However, it is also possible for the low-resistance region 6 or contact region 14 to be formed not only in the surface-layer portion at the peripheral portion of the first hetero semiconductor region 3 but also deeply into the area thereof contacted with the drain region 2, such as in case of a semiconductor device 100D shown in FIG. 21 (FIG. 21 exemplarily shows a situation of low-resistance region 6). The reason thereof is that the feature of the present invention can be exhibited, insofar as the electroconduction type of the contact portion 6a in the first hetero semiconductor region 3 contacted with the source electrode 7 is the first electroconduction type which is the same as the electroconduction type of the drain region 2 constituting the semiconductor substrate, and insofar as the impurity concentration of the contact portion 6a is higher than at least the impurity concentration of the gate-electrode facing portion 3a in the first hetero semiconductor region 3 positioned facingly to the gate electrode 5 through the gate insulator layer 4. Note that FIG. 21 is a cross-sectional view of a structure of a semiconductor device further different from that of FIG. 11 according to the first embodiment of the present invention.

Figure 21:
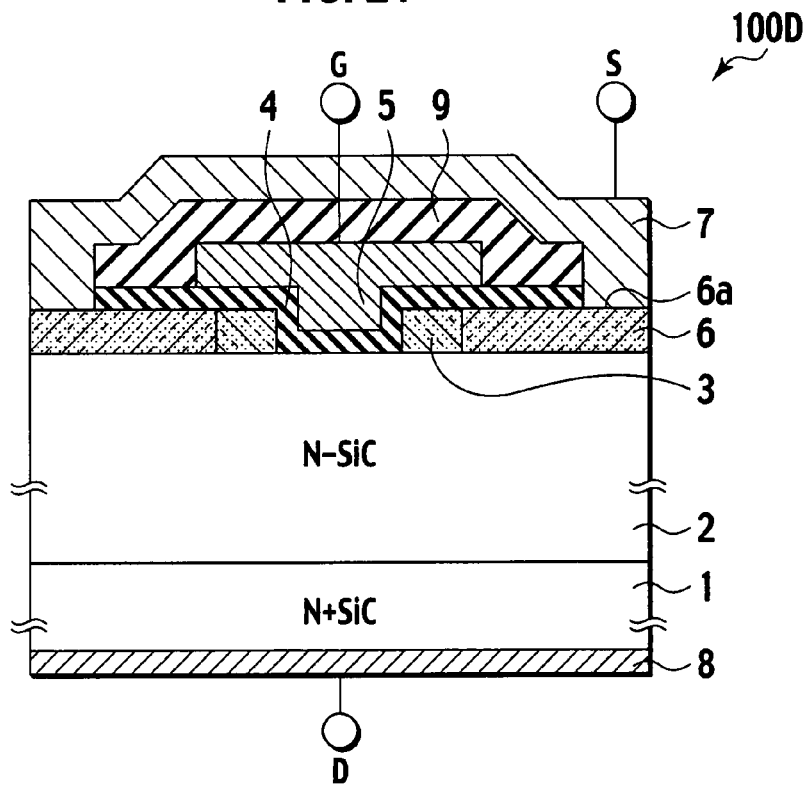
FIG. 21 is a cross-sectional view of a structure of a semiconductor device further different from that of FIG. 11 according to the first embodiment of the present invention.

Namely, also in the semiconductor device 100D of FIG. 21 and similarly to the semiconductor device 100 of FIG. 1, the semiconductor device 100A of FIG. 2, the semiconductor device 100B of FIG. 11, and the semiconductor device 100C of FIG. 17, no impurities are implanted into the gate-electrode facing portion 3a of the first hetero semiconductor region 3 positioned facingly to the gate electrode 5, to establish a structure where the gate field is scarcely shielded, thereby enabling the energy barrier at the drain region 2 side to be more steepened upon conduction to resultingly obtain a higher conduction performance.

Further, the portion, through which the gate-electrode facing portion 3a faced toward the gate electrode 5 is connected to the source electrode 7, can be established by the low-resistance region 6 at a low resistance as compared with the conventional structure to thereby enable decrease of the ON-resistance, and the contact resistance to the source electrode 7 can also be decreased, thereby enabling the ON-resistance to be further decreased. Note that although the configuration of the semiconductor device 100D of FIG. 21 is exhibited based on an example corresponding to the semiconductor device 100 of FIG. 1, the configuration can also be applied to structures corresponding to the semiconductor device 100A of FIG. 2, the semiconductor device 100B of FIG. 11, and the semiconductor device 100C of FIG. 17, respectively.

Furthermore, in at least a part of that region of the first hetero semiconductor region which underlies the low-resistance region 6 and which extends from the low-resistance region 6 down to contact with the drain region 2 constituting the semiconductor substrate such as in the semiconductor device 100 of FIG. 1 or the semiconductor device 100A of FIG. 2, it is possible to provide such a layered structure formed of a plurality of regions including impurities implanted thereinto in a manner to be different from one another adjoining region by adjoining region in electroconduction type and/or impurity concentration; and it is possible in this case that at least part of the region of the structure contacted with the drain region 2 of the semiconductor substrate is configured to be contacted with the source electrode 7.

Second Embodiment

There will be described a semiconductor device according to a second embodiment of the present invention.

Figure 22:
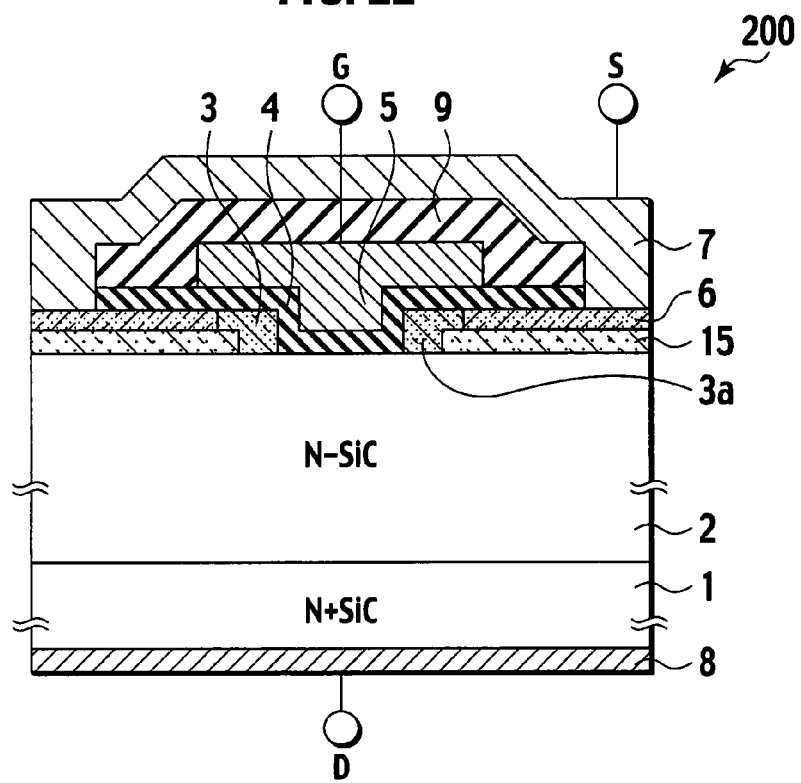
FIG. 22 is a cross-sectional view of a structure of a semiconductor device according to a second embodiment of the present invention.

FIG. 22 is a cross-sectional view of a structure of the semiconductor device according to the second embodiment of the present invention. Although the semiconductor device 200 of FIG. 22 is shown in its cross section where two structural unit cells are juxtaposed with each other, such cells are actually formed plurally in a parallel-connected manner to form the semiconductor device. Note that this embodiment will be also explained based on the semiconductor device exemplarily adopting silicon carbide as a substrate material, similarly to the first embodiment. In the following, configurations different from those of the first embodiment shown in FIG. 1 will be explained in detail.

In the semiconductor device 100 of the first embodiment shown in FIG. 1, the first hetero semiconductor region 3 of an N-type electroconduction type which is the same as the semiconductor substrate, has been formed between the low-resistance region 6 and the drain region 2. However, in the semiconductor device 200 of FIG. 22 in this embodiment, there is formed a second hetero semiconductor region 15 of a P-type electroconduction type different from that of the semiconductor substrate, in a manner to be contacted with the drain region 2, while the first hetero semiconductor region 3 is formed only at the channel portion, i.e., the gate-electrode facing portion 3a faced toward the gate electrode 5.

Although the second hetero semiconductor region 15 in the semiconductor device 200 of FIG. 22 is shown not to be contacted with the source electrode 7, the second hetero semiconductor region 15 may be connected, in at least a partial region such as a predetermined portion in the depth direction of the figure, to the source electrode 7. Note that, at the surface-layer portion (opposite side to the drain region 2), there is formed an N$^+$-type low-resistance region 6 adjacently to the peripheral portion of the gate electrode 5 through the gate insulator layer 4 similarly to the semiconductor device 100 according to the first embodiment of FIG. 1, and the low-resistance region 6 is connected to the source electrode 7.

(Example of Manufacturing Method)

There will be explained a manufacturing method of the semiconductor device 200 according to the second embodiment of the present invention shown in FIG. 22, with reference to FIG. 23 to FIG. 28. FIG. 23 to FIG. 28 are cross-sectional views of exemplary structures of intermediate products in respective steps of a process of manufacturing the semiconductor device 200 according to the second embodiment of the present invention, respectively, and show the exemplary structures of intermediate products in a first step to a sixth step, respectively.

Figure 23:
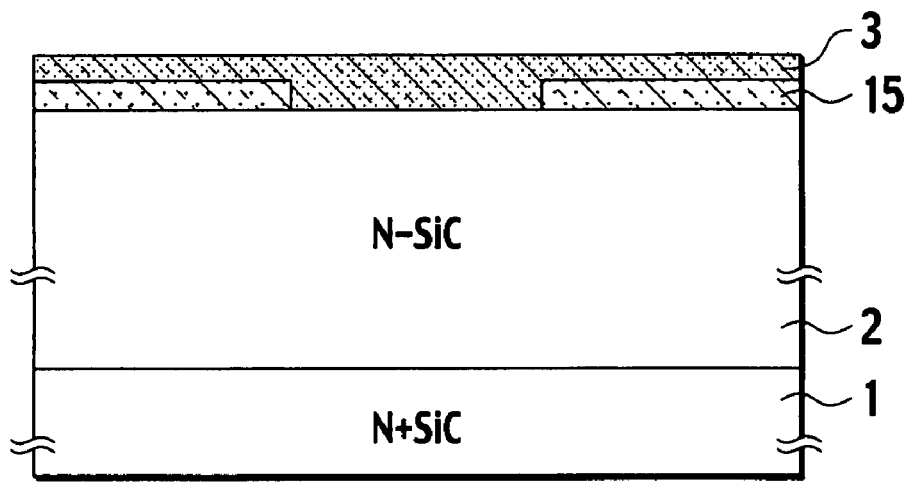
FIG. 23 is a cross-sectional view of an exemplary structure of an intermediate product in a first step of a process of manufacturing the semiconductor device according to the second embodiment of the present invention.

Firstly, as shown in a cross-sectional view at the first step (semiconductor substrate forming step, and a first half of a hetero semiconductor region forming step) of FIG. 23, there is formed a polycrystalline silicon layer exemplarily fabricated by an LP-CVD method on an N-type silicon carbide semiconductor substrate which has been formed by epitaxially growing an N$^-$-type drain region 2 on an N$^+$-type substrate region 1. Further, there is previously formed a second hetero semiconductor region 15 of P-type within the layer of N$^-$-type first hetero semiconductor region 3.

The first step of FIG. 23 shows a situation that the P-type second hetero semiconductor region 15 is formed only at a predetermined portion (peripheral region at the drain region 2 side) of the first hetero semiconductor region 3. However, when the impurity concentration of the P-type second hetero semiconductor region 15 is lower than that of the low-resistance region 6 to be formed by a later step, the P-type second hetero semiconductor region 15 may be formed at this time to spread up to the surface-layer portion (region at the peripheral portion of the hetero semiconductor region opposite to the drain region 2) where the low-resistance region 6 is to be formed later.

Here, examples of methods of forming a structure including the second hetero semiconductor region 15 of P-type in a predetermined portion of the first hetero semiconductor region 3 which contacts with the drain region 2 as shown in FIG. 23, include a method of depositing a polycrystalline silicon layer, subsequently implanting boron as impurity into a predetermined region of the polycrystalline silicon layer, and stacking a further polycrystalline silicon layer thereon, and a method of depositing a polycrystalline silicon layer, and subsequently implanting boron as impurity into a predetermined depth at a predetermined region of the polycrystalline silicon layer (i.e., into the peripheral region of the polycrystalline silicon layer contacted with the drain region 2 side).

Figure 24:
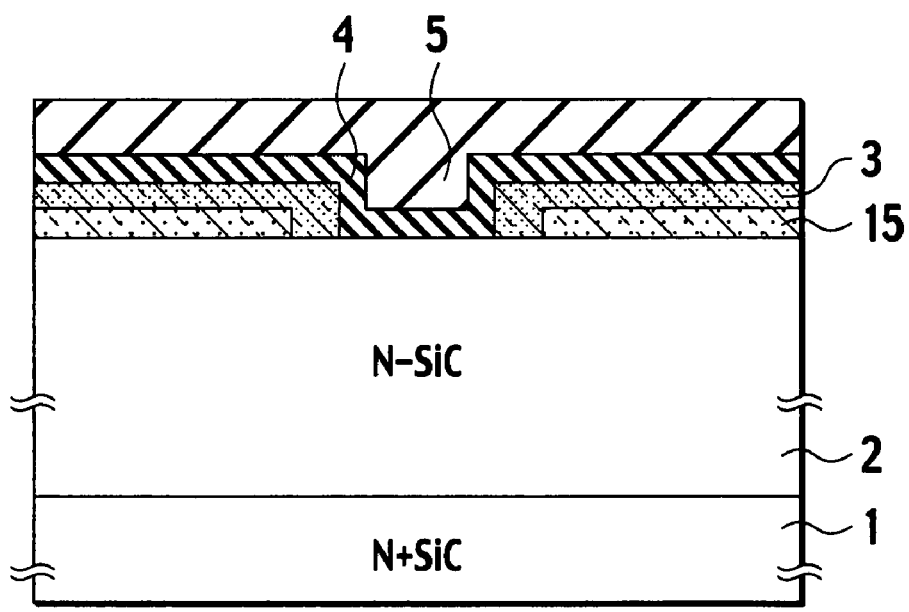
FIG. 24 is a cross-sectional view of an exemplary structure of an intermediate product in a second step of a process of manufacturing the semiconductor device according to the second embodiment of the present invention.

Next, as shown in a cross-sectional view of FIG. 24 in the second step (first half of hetero semiconductor region forming step, and gate electrode precursor layer forming step), there is formed a predetermined mask material on a predetermined region (peripheral region) of the precursor layer of the first hetero semiconductor region 3 of N$^-$-type exemplarily by photolithography, respectively, and then the precursor layer of the first hetero semiconductor region 3 of N$^-$-type is selectively etched by reactive ion etching (dry etching), thereby forming the first hetero semiconductor region 3 configured with the peripheral region, similarly to the second step of FIG. 4 of the first embodiment. At this time, it is possible to adopt a different material such as an SiO$_2$ film or SiN film as a mask material. It is further possible to adopt a different etching method such as a wet etching method or an etching method by oxidation and by oxide film removal, as an etching method of the precursor layer of the first hetero semiconductor region 3.

Further, in a state that the mask material is removed after etching of the precursor layer of the first hetero semiconductor region 3, it is possible to achieve removal of an etching damage due to the dry etching, by forming a sacrificial oxide film by dry O$_2$ oxidation at 900° C., for example, and by subsequently removing the sacrificial oxide film by wet etching by a mixed solution of ammonium fluoride and hydrofluoric acid, for example. Although the oxidation by dry O$_2$ is exemplarily referred to as a forming method of a sacrificial oxide film, any method will do that is capable of causing a region of the drain region 2 including an etching damage to be captured in the oxide film. Furthermore, depending on the type of the mask material, it is possible to achieve a step of removing an etching damage due to the dry etching, in a state that the mask material still remains.

Next, similarly to the third step of FIG. 5 in the first embodiment, there is formed a gate insulator layer 4 along surface-layer portions of the first hetero semiconductor region 3 and drain region 2. The gate insulator layer 4 may be formed by thermal oxidation, or may be formed by utilizing an oxide film formed by a CVD method. It is also possible to achieve an annealing step at a predetermined temperature or in a predetermined ambient, after forming an oxide film. Turning to the context, there is subsequently deposited a polycrystalline silicon layer formed by an LP-CVD method, for example, as a precursor layer of a gate electrode 5, on the gate insulator layer 4.

Figure 25:
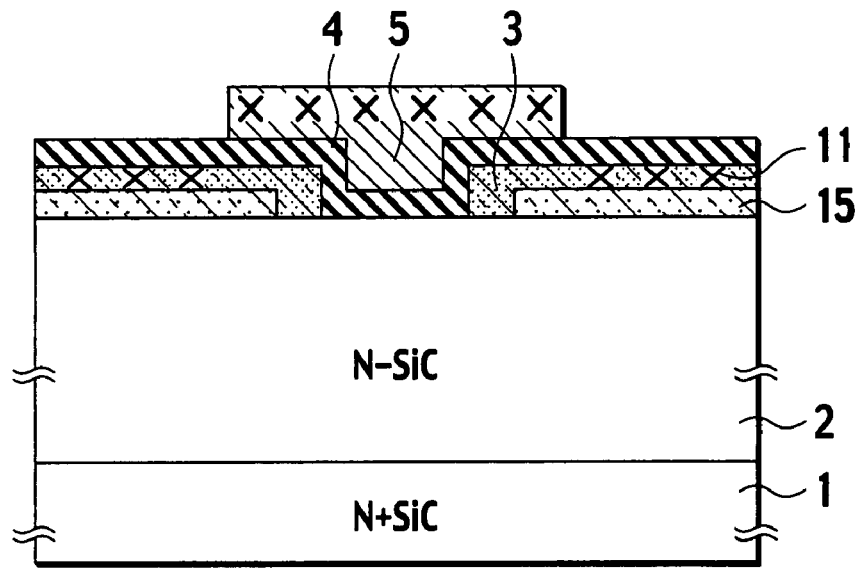
FIG. 25 is a cross-sectional view of an exemplary structure of an intermediate product in a third step of a process of manufacturing the semiconductor device according to the second embodiment of the present invention.

Then, as shown in a cross-sectional view of FIG. 25 in the third step (gate electrode forming step, gate electrode impurity implanting step, and low-resistance region forming step) and similarly to the fourth step of FIG. 6 in the first embodiment, there is formed a predetermined mask material exemplarily by photolithography on a predetermined region (central region) of the precursor layer of the gate electrode 5, and the precursor layer of the gate electrode 5 is selectively etched exemplarily by reactive ion etching (dry etching), thereby patterning the precursor layer into the gate electrode 5. At that time, it is possible to adopt a different material such as an $SiO_2$ film or an SiN film as the mask material.

Thereafter, similarly to the fifth step of FIG. 7 in the first embodiment, phosphorus or arsenic as impurity is implanted simultaneously into the surface-layer portion of the first hetero semiconductor region 3 and into the gate electrode 5 exemplarily by an ion implantation method, after removing the mask material. Although this embodiment is described for a situation that impurities are implanted into the surface-layer portion of the first hetero semiconductor region 3 through the gate insulator layer 4, it is possible to implant impurities after removing predetermined portions of the gate insulator layer 4 contacting with a portion of the first hetero semiconductor region into which the impurities are to be implanted. It is further possible to adopt a solid phase diffusion method or vapor phase diffusion method for implantation of impurities.

Figure 26:
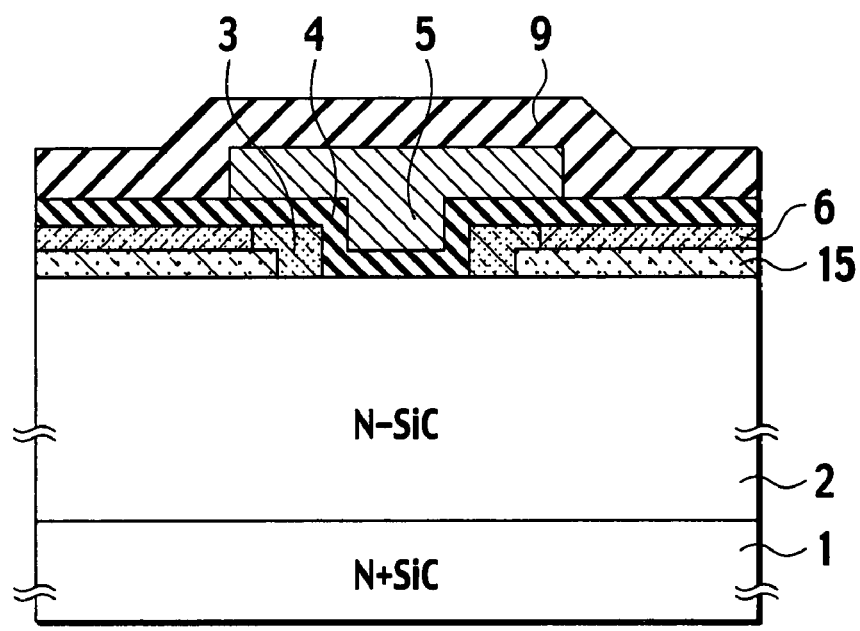
FIG. 26 is a cross-sectional view of an exemplary structure of an intermediate product in a fourth step of a process of manufacturing the semiconductor device according to the second embodiment of the present invention.

Then, as shown in a cross-sectional view of FIG. 26 in the fourth step (inter-layer insulator film forming step) and similarly to the sixth step of FIG. 8 in the first embodiment, there is formed an inter-layer insulator film 9 made of a silicon oxide film such as formed by a CVD method on the gate insulator layer 4 and gate electrode 5, and the impurities implanted into the surface-layer portion of the first hetero semiconductor region 3 and into the gate electrode 5 at the third step of FIG. 25 are activated exemplarily by heat treatment, thereby forming an $N^+$-type low-resistance region 6 and an $N^+$-type gate electrode 5, respectively (the symbol "+" indicates a high concentration). Since it is possible here to readily control a diffusion depth of the low-resistance region 6 by controlling a temperature, time, and the like of the heat treatment, it is possible to form the low-resistance region 6 in a manner to be also positioned just below and adjacent to the periphery of the gate electrode 5 through the gate insulator layer 4.

Figure 27:
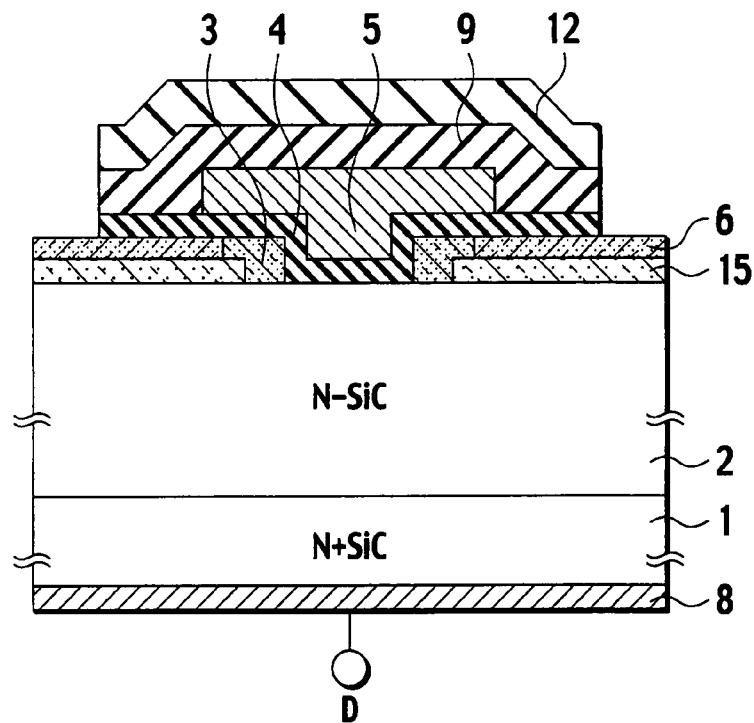
FIG. 27 is a cross-sectional view of an exemplary structure of an intermediate product in a fifth step of a process of manufacturing the semiconductor device according to the second embodiment of the present invention.

Next, as shown in a cross-sectional view of FIG. 27 in the fifth step (drain electrode forming step and contact hole forming step) and similarly to the seventh step of FIG. 9 in the first embodiment, the substrate region 1 corresponding to a reverse surface side of the semiconductor device is brought to be formed with a drain electrode 8 such as made of titanium (Ti) or nickel (Ni). Subsequently, there is used a predetermined mask material 12 formed on a predetermined region (except for peripheral region) of the inter-layer insulator film 9, thereby selectively etching peripheral region of the inter-layer insulator film 9 such as by reactive ion etching (dry etching) to open a contact hole.

Figure 28:
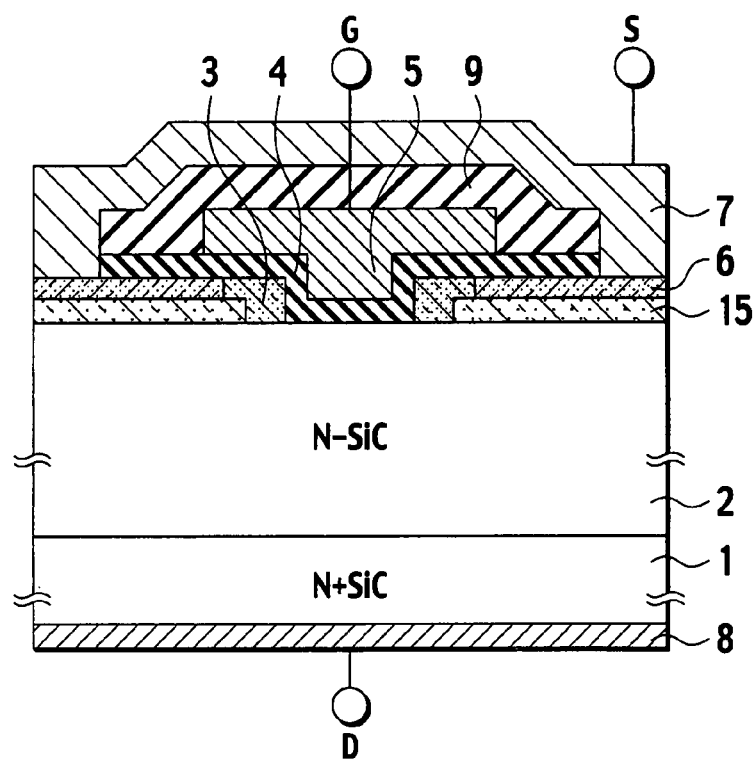
FIG. 28 is a cross-sectional view of an exemplary structure of an intermediate product in a sixth step of a process of manufacturing the semiconductor device according to the second embodiment of the present invention.

Finally, as shown in a cross-sectional view of FIG. 28 in the sixth step (source electrode forming step) and similarly to the eighth step of FIG. 10 in the first embodiment, the mask material 12 is removed, followed by formation of a source electrode 7 by successively depositing titanium (Ti) and aluminum (Al) in a manner to connect to the low-resistance region 6 via contact hole, thereby completing the semiconductor device 200 according to the second embodiment of the present invention shown in FIG. 22.

As described above, the semiconductor device 200 of this embodiment can be readily produced by the conventional manufacturing techniques, similarly to the semiconductor device 100 of the first embodiment and the like.

Further, in this embodiment, the step of implanting impurities into the first hetero semiconductor region 3 and gate electrode 5 shown in the third step of FIG. 25 is arranged in an order at least after the step of using the predetermined mask material 10 to pattern the gate electrode 5, thereby allowing for formation of the low-resistance region 6 without affected by heat treatments to be performed upon, before, or after formation of the gate insulator layer 4, to enable an impurity concentration, thickness, and the like of the low-resistance region 6 to be controlled very easily, similarly to the first embodiment. Particularly, when polycrystalline silicon is adopted as the first hetero semiconductor region 3 such as in this embodiment, diffusion of impurities is made fast as compared with single crystal silicon such that exposure of the polycrystalline silicon to a thermal process improving a quality of the gate insulator layer 4 can be avoided, thereby resultingly and remarkably improving the controllability of formation of the low-resistance region 6.

As described above, formation of the low-resistance region 6 in the first hetero semiconductor region 3 enables contact resistances thereof with the source electrode 7 to be further decreased. Further, this embodiment is exemplified for a situation that the low-resistance region 6 is formed to have a predetermined thickness at the surface-layer portion side contacted with the source electrode 7, and the region under the low-resistance region to be connected by heterojunction to the drain region 2 is formed as the second hetero semiconductor region 15. In this way, formation of the second hetero semiconductor region 15 of the electroconduction type different from that of the drain region 2 constituting the semiconductor substrate enables obtainment of a withstand voltage to be determined by the heterojunction between the drain region 2 and second hetero semiconductor region 15, such that the withstand voltage is made higher than that of the first embodiment.

Further, upon implantation of impurities into the first hetero semiconductor region 3 in this embodiment as shown in the third step of FIG. 25, impurities are selectively implanted into the peripheral region of the first hetero semiconductor region 3 by utilizing the gate electrode 5 similarly to the first embodiment, so that no impurities are implanted into a gate-electrode opposing portion 3a arranged at a position opposing to and adjacently to the gate electrode 5. This allows the gate-electrode opposing portion 3a to have the same switching characteristic as that of a conventional structure, while the source electrode 7 and gate-electrode opposing portion 3a are connected to each other at a low resistance by virtue of the low-resistance region 6 configured with the contact portion 6a and electroconductive portion 6b, thereby enabling an ON-resistance to be further decreased as compared with the conventional structure.

Further, upon implantation of impurities into the first hetero semiconductor region 3 in this embodiment as shown in the third step of FIG. 25, impurities are simultaneously implanted into the gate electrode 5 to establish it into an $N^+$-type one similarly to the first embodiment, thereby enabling simplification of the $N^+$-type impurity implanting step to enable a restricted manufacturing cost.

The semiconductor device 200 of FIG. 22 has been exemplified for a situation that only the second hetero semiconductor region 15 is formed in a layer underlying the low-resistance region 6, in a manner to be contacted with the drain region 2 of the semiconductor substrate. However, in at least a part of the layer underlying the low-resistance region 6 in a manner to extend therefrom down to contact with the drain region 2 constituting the semiconductor substrate, it is possible to provide such a layered structure formed of a plurality of regions including impurities implanted thereinto in a manner to be different from one another adjoining region by adjoining region in electroconduction type and/or impurity concentration; and it is possible in this case that at least part of the region of the structure contacted with the drain region 2 of the semiconductor substrate is contacted with the source electrode 7.

(Another Example of Manufacturing Method in Second Embodiment)

There will be explained another manufacturing method of the semiconductor device 200 of FIG. 22 according to the second embodiment of the present invention with reference to FIG. 29 to FIG. 31, which method is further decreased in manufacturing cost as compared with the manufacturing method of FIG. 23 to FIG. 28. Here, FIG. 29 to FIG. 31 are cross-sectional views of exemplary structures of intermediate products in respective steps of a process of manufacturing the semiconductor device 200 according to the second embodiment of the present invention in a manner different from the manufacturing method of FIG. 23 to FIG. 28, and show the exemplary structures of intermediate products in a fifth step to a seventh step, respectively, subsequent to the applicable midway step of the manufacturing method of the semiconductor device 100, for example.

Figure 29:
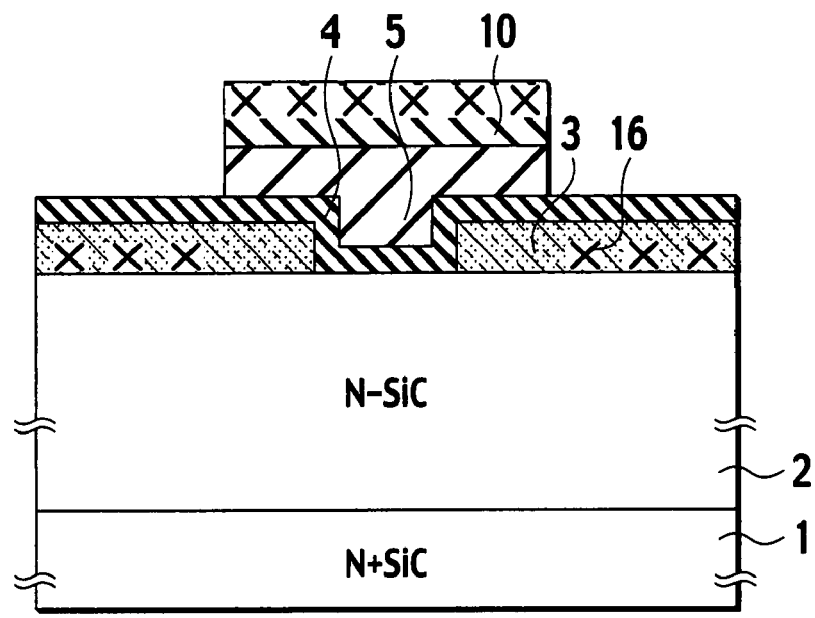
FIG. 29 is a cross-sectional view of an exemplary structure of an intermediate product in a second step of a process of manufacturing the semiconductor device different from that of FIG. 24 according to the second embodiment of the present invention.

Namely, the same steps such as the first step of FIG. 3 to the fourth step of FIG. 6 in the first embodiment are adopted as a first step to a fourth step for this semiconductor device up to deposition of a polycrystalline silicon layer to be matured into a gate electrode on the gate insulator layer 4 formed at the surface-layer portions of the first hetero semiconductor region 3 and drain region 2 followed by patterning of gate electrode 5 by the mask material 10, and then the process for this semiconductor device is progressed to a step of FIG. 29. Particularly note that, in the following description, the first step of FIG. 3 to the fourth step of FIG. 6 are collectively regarded as a first step of this example, and the steps in FIG. 29 to FIG. 31 will be read as a second step to a fourth step, in order to coordinate this example with the manufacturing process of FIG. 23 to FIG. 28 explained above as the example of manufacturing method of the second embodiment.

Firstly, as shown in a cross-sectional view of FIG. 29 in the second step, boron as impurity is implanted into a predetermined region at a predetermined depth of the first hetero semiconductor region 3 (i.e., peripheral region thereof contacted with the drain region 2 side) exemplarily by an ion implantation method in a state that the mask material 10 is unremoved. At this time, the mask material 10 is present on the gate electrode 5 in this example, so that no impurities reach the gate electrode 5.

Figure 30:
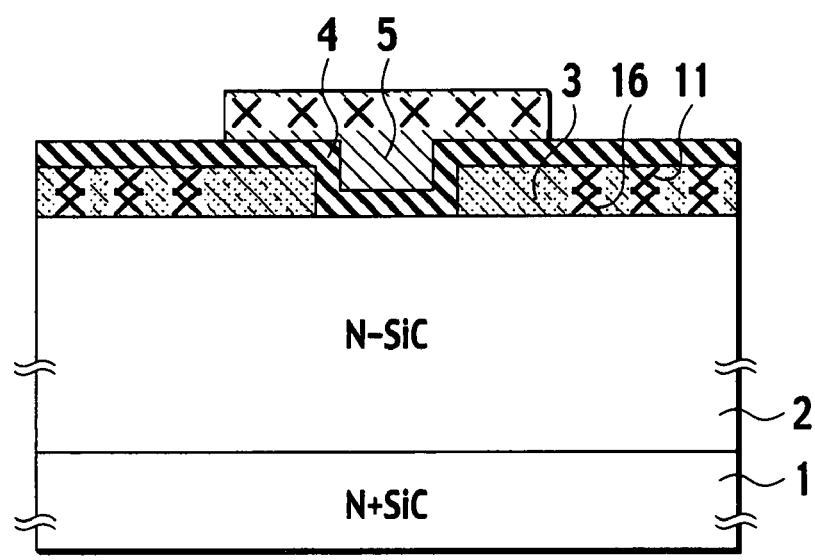
FIG. 30 is a cross-sectional view of an exemplary structure of an intermediate product in a third step of a process of manufacturing the semiconductor device different from that of FIG. 25 according to the second embodiment of the present invention.
Figure 31:
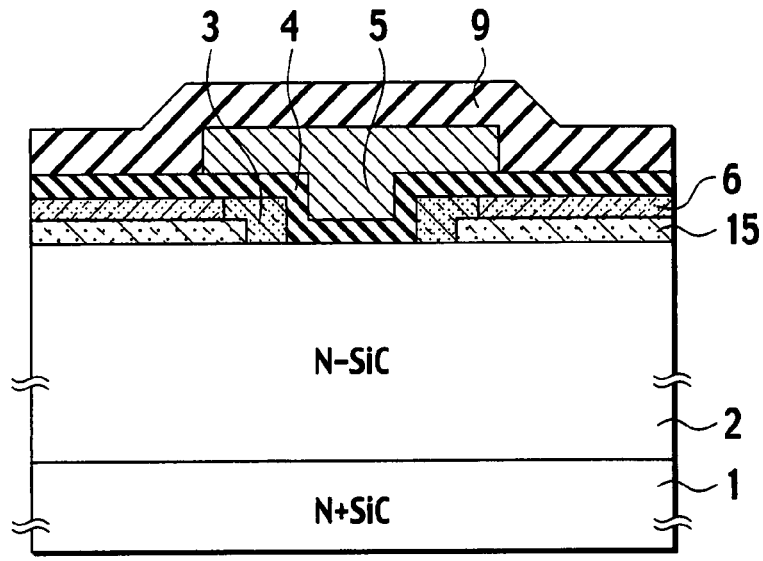
FIG. 31 is a cross-sectional view of an exemplary structure of an intermediate product in a fourth step of a process of manufacturing the semiconductor device different from that of FIG. 26 according to the second embodiment of the present invention.

Further, as shown in a cross-sectional view of FIG. 30 in the third step and similarly to the latter half of the third step in FIG. 25, phosphorus or arsenic as impurity is implanted simultaneously into a predetermined region of the first hetero semiconductor region 3 (i.e., surface-layer portion thereof opposite to the drain region 2 side) and into the gate electrode 5 exemplarily by an ion implantation method, after removing the mask material 10. Although this example is described for a situation that impurities are implanted into the surface-layer portion of the first hetero semiconductor region 3 through the gate insulator layer 4, it is possible to implant impurities after removing a predetermined portion of the gate insulator layer 4 contacting with a portion of the first hetero semiconductor region into which the impurities are to be implanted. Note that it is not problematic to implant boron for P-type in a manner to include the surface-layer portion side of the first hetero semiconductor region 3, insofar as the impurity concentration of boron for P-type to be implanted into the predetermined region at the predetermined depth of the first hetero semiconductor region 3 (i.e., peripheral region thereof contacted with the drain region 2 side) is lower than the impurity concentration of phosphorus or arsenic for N-type.

Then, as shown in a cross-sectional view of FIG. 31 in the fourth step and similarly to the fourth step of FIG. 26, there is formed an inter-layer insulator film 9 made of a silicon oxide film such as formed by a CVD method on the gate insulator layer 4 and gate electrode 5, and the impurities implanted into the predetermined regions of the first hetero semiconductor region 3 and into the gate electrode 5 in the second step of FIG. 29 and the third step of FIG. 30 are activated exemplarily by heat treatment, thereby forming a $P^+$-type second hetero semiconductor region 15, an $N^+$-type low-resistance region 6, and an $N^+$-type gate electrode 5, respectively. Since it is possible here to readily control a diffusion depth of the low-resistance region 6 by controlling a temperature, time, and the like of the heat treatment, it is possible to readily form the low-resistance region 6 in a manner to be also positioned just below and adjacent to the periphery of the gate electrode 5 through the gate insulator layer 4.

Thereafter, the semiconductor device 200 according to the second embodiment of the present invention shown in FIG. 22 is completed by the same steps as the fifth step of FIG. 27 and the sixth step of FIG. 28.

As described above, the manufacturing method of manufacturing the semiconductor device 200 of this embodiment shown FIG. 29 to FIG. 31 can also be readily realized by the conventional manufacturing techniques similarly to the manufacturing method shown in FIG. 23 to FIG. 28. Simultaneously therewith, the second hetero semiconductor region 15 and the low-resistance region 6 can be formed by utilizing the same mask, thereby enabling further simplification of the manufacturing process, and also enhancing a positional accuracy by virtue of self-alignment.

Further, in this manufacturing method, the steps of implanting P-type and N-type impurities into the first hetero semiconductor region 3 and gate electrode 5 such as shown in the second step of FIG. 29 and the third step of FIG. 30 are arranged in orders at least after the step of using the predetermined mask material 10 to pattern the gate electrode 5, thereby allowing for formation of the low-resistance region 6 and second hetero semiconductor region 15 without affected by heat treatments to be performed upon, before, or after formation of the gate insulator layer 4, to enable an impurity concentration, thickness, and the like of the low-resistance region 6 and second hetero semiconductor region 15 to be controlled very easily.

Particularly, when polycrystalline silicon is adopted as the first hetero semiconductor region 3 such as in this embodiment, diffusion of impurities is made fast as compared with single crystal silicon such that exposure of the polycrystalline silicon to a thermal process improving a quality of the gate insulator layer 4 can be avoided, thereby resultingly and remarkably improving the controllability of formation of the second hetero semiconductor region 15 similarly to formation of the low-resistance region 6.

(Example of Operation)

The semiconductor device 200 shown in FIG. 22 will be now explained for an example of operation. This embodiment is used by exemplarily grounding the source electrode 7 and applying a positive potential to the drain electrode 8.

Firstly, when the gate electrode 5 is exemplarily held at a ground potential or negative potential, the semiconductor device 200 keeps a non-conduction state. The reason thereof is that an energy barrier against conduction electrons is formed at the heterojunction interface between the first hetero semiconductor region 3 and the drain region 2.

At this time, this embodiment is provided by the above manufacturing method enabling a situation where the low-resistance region 6 is formed into a predetermined thickness, and the second hetero semiconductor region 15 of the electroconduction type different from that of the drain region 2 forming the semiconductor substrate is formed in that region under the low-resistance region 6 which contacts with the drain region 2. This enables obtainment of a withstand voltage to be determined by the heterojunction between the drain region 2 and second hetero semiconductor region 15. As a result, the work function difference between the drain region 2 and second hetero semiconductor region 15 is larger than the work function difference between the drain region 2 and first hetero semiconductor region 3, thereby further enhancing the certainty of non-conduction state than the semiconductor device 100 of the first embodiment.

Next, when a positive potential is applied to the gate electrode 5 so as to turn the non-conduction state into a conduction state, the gate field spreads through the gate insulator layer 4 and up to the heterojunction interface where the first hetero semiconductor region 3 contacts with the drain region 2, thereby forming storage layers of conduction electrons at the surface-layer portion of the gate-electrode facing portion 3a of the first hetero semiconductor region 3 and the surface-layer portion of the drain region 2, adjacent to the gate electrode 5, similarly to the first embodiment. This resultingly pushes down the potential at the first hetero semiconductor region 3 side at the junction interface between the first hetero semiconductor region 3 and the drain region 2 adjacent to the gate electrode 5, and steepens the energy barrier at the drain region 2 side, thereby enabling conduction electrons to be conducted through the energy barrier.

At this time, upon implantation of impurities into the first hetero semiconductor region 3 also in this embodiment as described above and similarly to the first embodiment, impurities are selectively implanted into the peripheral region of the first hetero semiconductor region 3 by utilizing the gate electrode 5, so that no impurities are implanted into the gate-electrode facing portion 3a at the central portion of the first hetero semiconductor region 3 facing toward the gate electrode 5, thereby establishing a structure where the gate field is scarcely shielded. This enables the energy barrier at the drain region 2 side to be more steepened, thereby enabling obtainment of a higher conduction performance. Further, the portion, through which the gate-electrode facing portion 3a is connected to the source electrode 7, can be established by the low-resistance region 6 at a low resistance as compared with the conventional structure, and the contact resistance to the source electrode 7 can also be decreased, thereby enabling the ON-resistance to be further decreased.

Next, the gate electrode 5 is again brought to a ground potential so as to turn the semiconductor device from the conduction state into the non-conduction state, so that the storage state of conduction electrons stored at the heterojunction interface between the first hetero semiconductor region 3 and drain region 2 is released, thereby stopping tunneling of conduction electrons through the energy barrier, similarly to the first embodiment. Thereafter, flow of conduction electrons from the first hetero semiconductor region 3 into the drain region 2 is stopped, and conduction electrons included in the drain region 2 subsequently flow out into the substrate region 1 and are thus depleted, upon which a depletion layer is spread from the heterojunction region with the first hetero semiconductor region 3 into the drain region 2 side, thereby bringing about the non-conduction state.

Also in this embodiment, it is possible to exemplarily ground the source electrode 7 and apply a negative potential to the drain electrode 8, thereby achieving a reverse conduction (backflow operation), similarly to the first embodiment.

For example, when the source electrode 7 and gate electrode 5 are each kept at a ground potential and a predetermined negative voltage is applied to the drain electrode 8, the energy barrier against conduction electrons disappears, so that conduction electrons flow from the drain region 2 side into the first hetero semiconductor region 3 side and the second hetero semiconductor region 15 side, thereby achieving a reverse conduction state. At this time, conduction is attained only by conduction electrons without injection of positive holes, thereby also decreasing a loss due to a reverse recovery current upon transition from the reverse conduction state into a non-conduction state. Note that it is also possible to use the gate electrode 5 as a control electrode applying a control voltage, instead of grounding the gate electrode 5.

(Different Structural Example of Semiconductor Device in Second Embodiment)

Figure 32:
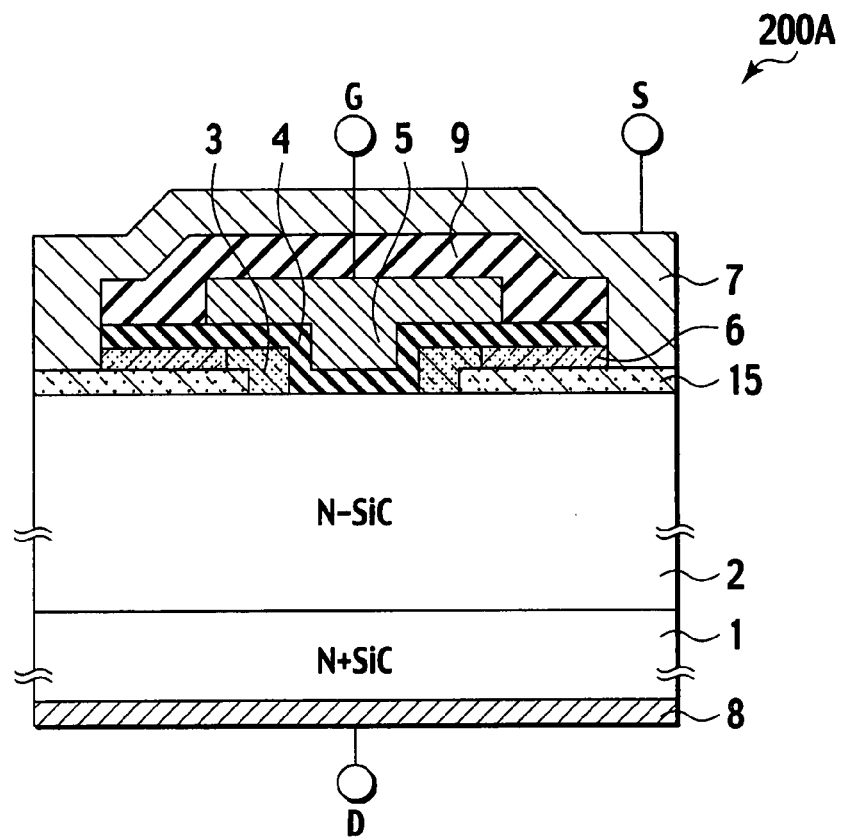
FIG. 32 is a cross-sectional view of a structure of a semiconductor device different from that of FIG. 22 according to the second embodiment of the present invention.

Although the semiconductor device 200 of FIG. 22 has been exemplarily described for the feature of this embodiment, the source electrode 7 may be directly contacted with the second hetero semiconductor region 15 by such a structure of a semiconductor device 200A shown in FIG. 32. Here, FIG. 32 is a cross-sectional view of the structure of the semiconductor device different from that of FIG. 22 according to the second embodiment of the present invention.

(Example of Manufacturing Method)

There will be explained a manufacturing method of the semiconductor device 200A shown in FIG. 32 having the different structure according to the second embodiment of the present invention, with reference to FIG. 33 and FIG. 34. Here, FIG. 33 and FIG. 34 are cross-sectional views of exemplary structures of intermediate products in respective steps of a process of manufacturing the semiconductor device 200A which is different from FIG. 22 according to the second embodiment of the present invention, and show the exemplary structures of intermediate products in a fifth step and a sixth step, respectively, subsequent to the applicable midway step of the manufacturing method of the semiconductor device 200.

Figure 33:
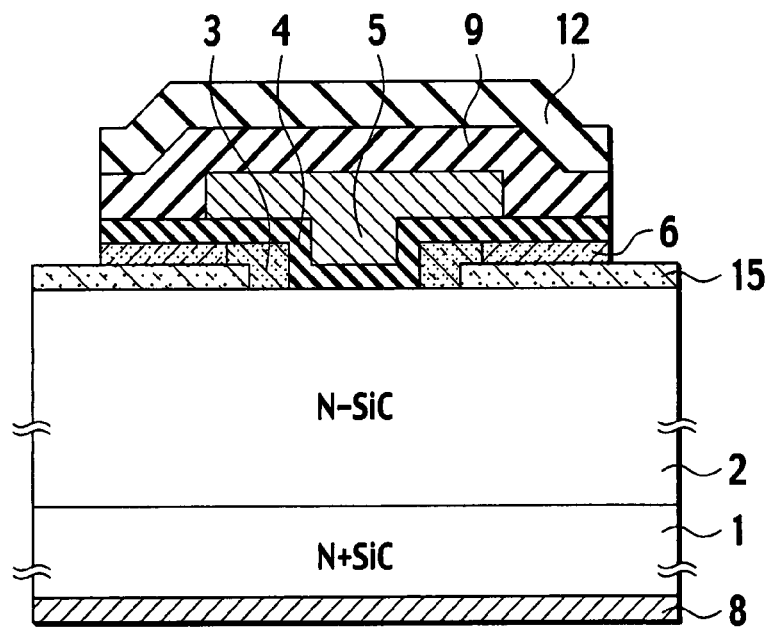
FIG. 33 is a cross-sectional view of an exemplary structure of an intermediate product in a fifth step of a process of manufacturing the semiconductor device different from that of FIG. 22 according to the second embodiment of the present invention.

Namely, the same steps such as those up to the step of FIG. 26 or the step of FIG. 31 for the semiconductor device 200 of FIG. 22 are adopted as a first step to a fourth step for this semiconductor device up to selective etching of a precursor layer of a gate electrode 5 to pattern the layer into the gate electrode 5, and then the process for this semiconductor device is progressed to the fifth step of FIG. 33.

Firstly, as shown in a cross-sectional view in the fifth step (drain electrode forming step, and contact hole forming step) of FIG. 33, the substrate region 1 corresponding to a reverse surface side of the semiconductor device is brought to be formed with a drain electrode 8 such as made of titanium (Ti) or nickel (Ni). Subsequently, there is used a predetermined mask material 12 formed on the inter-layer insulator film 9, thereby successively and selectively etching predetermined etching regions (peripheral regions) of the inter-layer insulator film 9, gate insulator layer 4, and low-resistance region 6 such as by reactive ion etching (dry etching) to open a contact hole.

Figure 34:
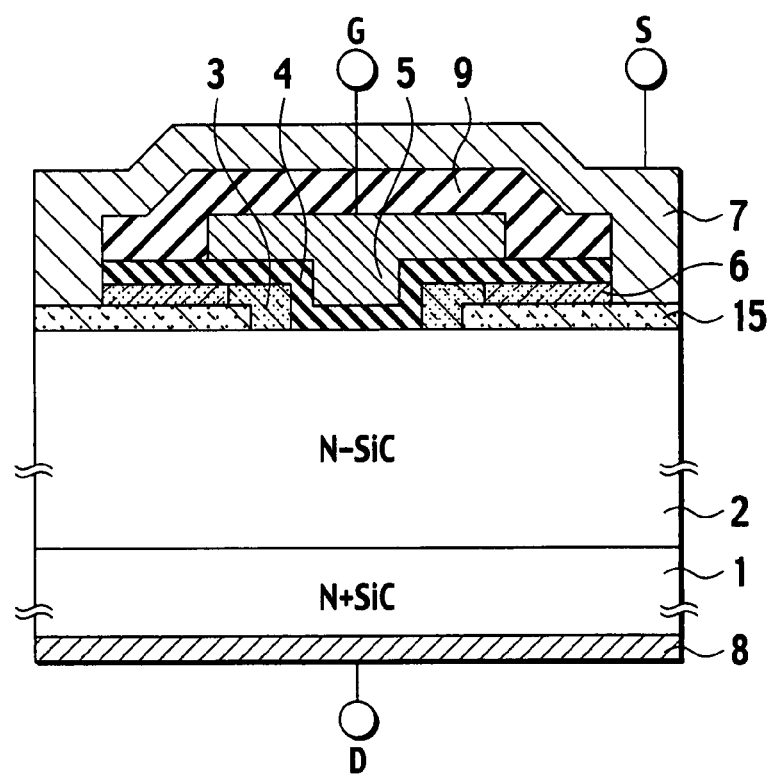
FIG. 34 is a cross-sectional view of an exemplary structure of an intermediate product in a sixth step of a process of manufacturing the semiconductor device different from that of FIG. 22 according to the second embodiment of the present invention.

Thereafter, as shown in a cross-sectional view of FIG. 34 in the sixth step (source electrode forming step), the mask material 12 is removed, followed by formation of a source electrode 7 by successively depositing titanium (Ti) and aluminum (Al) in a manner to connect to a sidewall of the low-resistance region 6 (i.e., that surface thereof which is not parallel to the first main surface of the semiconductor substrate) and to the second hetero semiconductor region 15 via contact hole, thereby completing the semiconductor device 200A of FIG. 32 which is different from that in FIG. 22 according to the second embodiment of the present invention.

According to the configuration of the semiconductor device 200A in FIG. 32, the second hetero semiconductor region 15 is made to have an electrode contact surface directly contacted with the source electrode 7, so that the second hetero semiconductor region 15 is enabled to have an inner-plane fixed at a uniform source potential, thereby enabling improvement of surge resistance upon transference into a non-conduction state, reverse conduction characteristic upon transference into a reverse conduction state, and the like.

Note that although this embodiment has been explained for a situation that, in the layer underlying the low-resistance region 6, there is formed only one layer of second hetero semiconductor region 15 having an impurity concentration, electroconduction type, and the like different from those of the neighboring regions such as the low-resistance region 6 and first hetero semiconductor region 3, it is possible to form a plurality of layers, i.e., two or more layers, without limited to the only one layer. In such a case, layers are to be formed differently from each other adjoining layer by adjoining layer in impurity concentration and/or electroconduction type. It is also possible to form a plurality of layer structures in each of a plurality of regions.

Although the second embodiment has been exemplarily described with reference to FIG. 22 to FIG. 34, it is also possible to obtain the same effect even by semiconductor devices having partly modified structures such as shown in FIG. 11 to FIG. 21 explained in the first embodiment. Namely, it is possible to adopt the P-type gate electrode 13 such as in the semiconductor device 100B of FIG. 11, to form the contact region 14 instead of low-resistance region 6 such as in the semiconductor device 100C of FIG. 17, or to form the low-resistance region 6 or contact region 14 not only in the surface-layer portion at the peripheral portion of the first hetero semiconductor region 3 but also in the portion to be contacted with the drain region 2 in such a manner exemplified in the semiconductor device 100D of FIG. 21. It is further possible to adopt the trench type configuration, like the semiconductor device 100A of FIG. 2.

Third Embodiment

There will be described a semiconductor device according to a third embodiment of the present invention.

(Structural Example)

Figure 35:
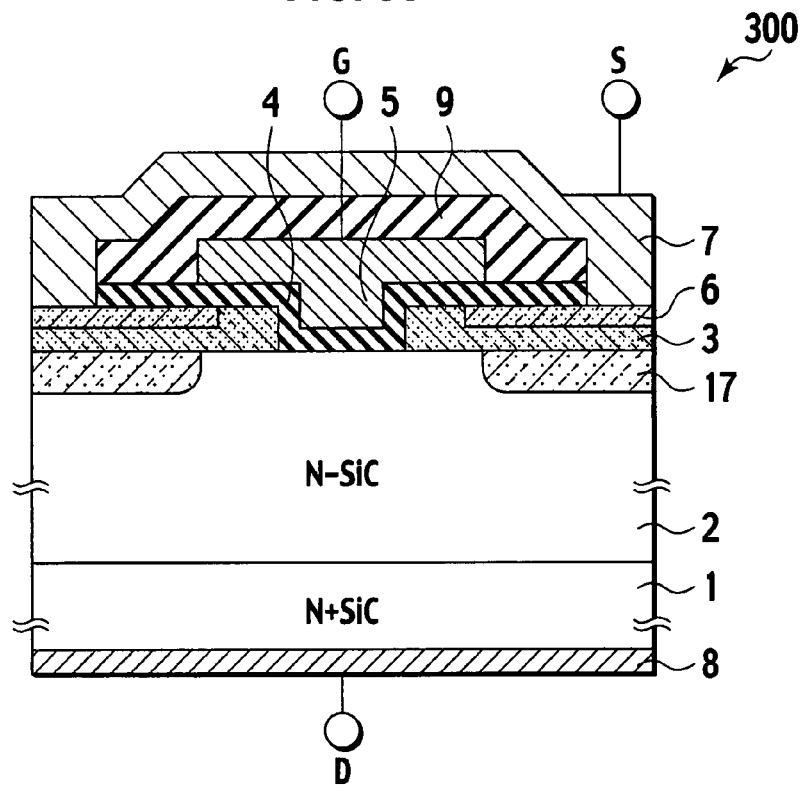
FIG. 35 is a cross-sectional view of a structure of a semiconductor device according to a third embodiment of the present invention.
Figure 36:
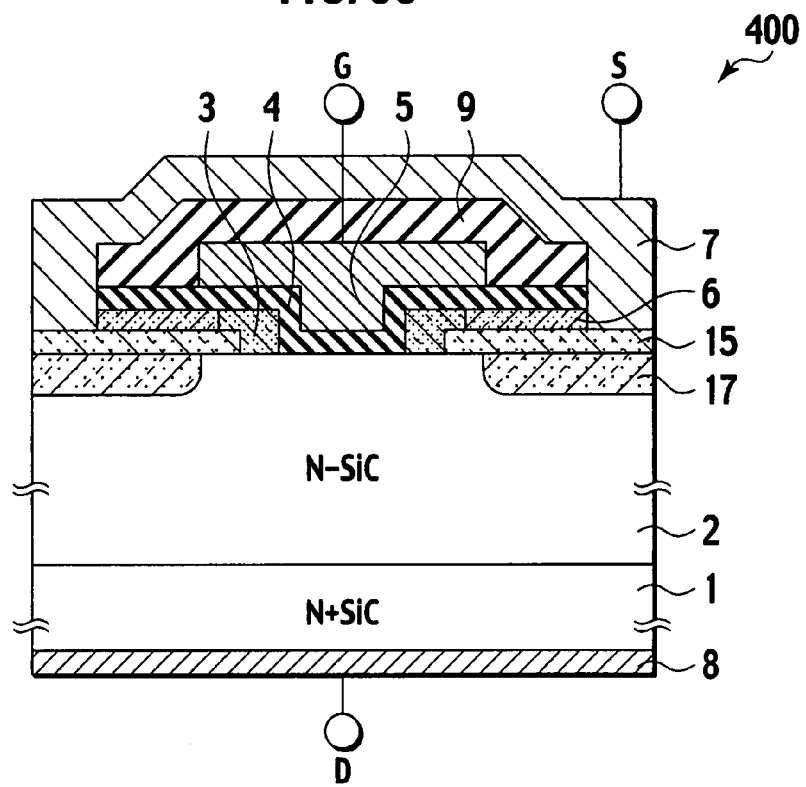
FIG. 36 is a cross-sectional view of a structure of a semiconductor device different from that of FIG. 35 according to the third embodiment of the present invention.

FIG. 35 is a cross-sectional view of a structure of a semiconductor device according to a third embodiment of the present invention. Further, FIG. 36 is a cross-sectional view of a structure of a semiconductor device different from that of FIG. 35 according to the third embodiment of the present invention. Here, the semiconductor device 300 in FIG. 35 corresponds to the semiconductor device 100 in FIG. 1 according to the first embodiment, the semiconductor device 400 in FIG. 36 corresponds to the semiconductor device 200 in FIG. 22 according to the second embodiment, and both the semiconductor devices exemplify configuration examples each further formed with a first field limiting region 17. There will be explained those portions of the semiconductor device 300 in FIG. 35 and the semiconductor device 400 in FIG. 36 which are different from the semiconductor device 100 in FIG. 1 and the semiconductor device 200 in FIG. 22, respectively.

As described above, the semiconductor device 300 in FIG. 35 and the semiconductor device 400 in FIG. 36 exemplify such situations that first field limiting regions 17 are further formed at first main surface-layer portions over peripheral portions of the drain regions 2 of the semiconductor device 100 in FIG. 1 and the semiconductor device 200 in FIG. 22, respectively. The first field limiting region 17 may be formed of a P-type semiconductor region as a second electroconduction type different from the electroconduction type of the drain region 2 of the semiconductor substrate, or may be formed of a high-resistance region, insulator region, or the like.

(Example of Manufacturing Method)

Further, the manufacturing methods of the semiconductor device 300 in FIG. 35 and the semiconductor device 400 in FIG. 36 allow for easy manufacturing thereof, similarly to the structures shown in the first embodiment and second embodiment.

For example, it is possible to form the first field limiting region 17 by implanting ions of aluminum or boron into a predetermined region of the drain region 2 by a mask made of a masking layer having a predetermined opening (such as an opening exposing a predetermined region over a peripheral portion of the drain region 2), before forming the precursor layer of the first hetero semiconductor region 3 on the drain region 2 in the first step in FIG. 3 manufacturing the semiconductor device 100 in FIG. 1 according to the first embodiment. Here, the field limiting region forming step may be arranged to be later than the gate electrode forming step, in a manner to utilize the gate electrode 5 itself or a mask material used to form the gate electrode 5, upon implanting impurities such as aluminum ions or boron ions so as to form the field limiting region 17. Alternatively, the field limiting region forming step may be arranged to be later than the contact hole forming step, in a manner that the mask material for contact hole formation used for patterning the inter-layer insulator film 9 is utilized to form the field limiting region 17.

Note that the field limiting region may be formed by a solid phase diffusion method instead of ion implantation, in case of implanting impurities such as aluminum ions or boron ions. The steps thereafter are the same as those from the first step forming the precursor layer of the first hetero semiconductor region 3 in FIG. 3 to the eighth step of FIG. 10 exemplarily described for the first embodiment, or those from the first step forming the polycrystalline silicon layer in FIG. 23 to the sixth step in FIG. 28 exemplarily described for the second embodiment.

(Another Example of Manufacturing Method in Third Embodiment)

Concerning manufacturing methods of manufacturing the semiconductor device 300 in FIG. 35 and the semiconductor device 400 in FIG. 36 according to the third embodiment of the present invention, there will be explained a manufacturing method of manufacturing the semiconductor device 400 in FIG. 36 by way of example with reference to FIG. 37 to FIG. 40, which manufacturing method enables a further decreased manufacturing cost as compared with the above-mentioned manufacturing methods. Here, FIG. 37 to FIG. 40 are cross-sectional views of exemplary structures of intermediate products in respective steps of a process of manufacturing the semiconductor device 400 according to the third embodiment of the present invention, and show the exemplary structures of intermediate products in a fifth step to an eighth step, respectively, subsequent to the applicable midway step of the manufacturing method of the semiconductor device 100, for example.

Figure 37:
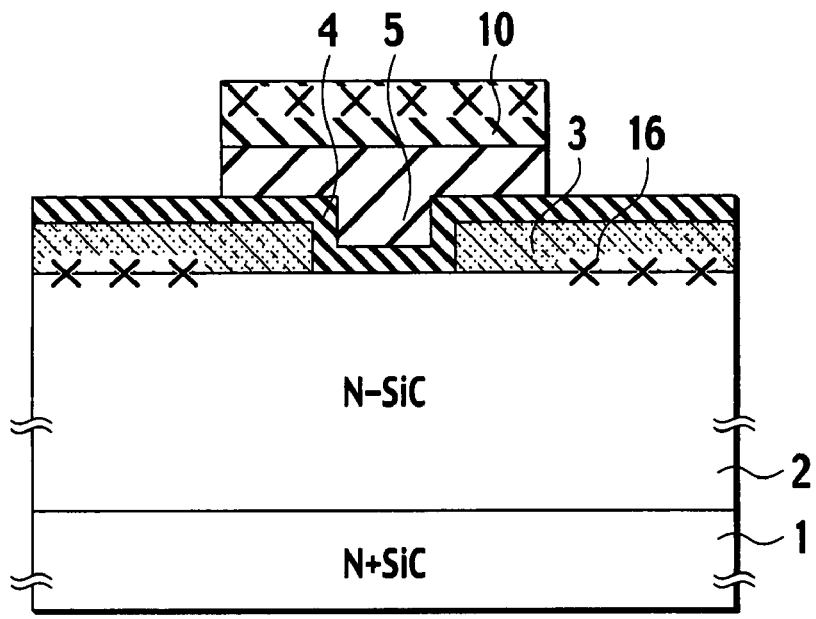
FIG. 37 is a cross-sectional view of an exemplary structure of an intermediate product in a fifth step of the process of manufacturing the semiconductor device according to the third embodiment of the present invention.

Namely, the same steps such as the first step of FIG. 3 to the fourth step of FIG. 6 in the first embodiment are adopted as a first step to a fourth step for this semiconductor device up to deposition of a polycrystalline silicon layer to be matured into a gate electrode on the gate insulator layer 4 formed at the surface-layer portions of the first hetero semiconductor region 3 and drain region 2 followed by patterning of gate electrode 5 by the mask material 10, and then the process for this semiconductor device is progressed to the fifth step of FIG. 37.

Firstly, as shown in a cross-sectional view of FIG. 37 in the fifth step (contact region forming step or low-resistance region forming step, and field limiting region forming step), boron as impurity is implanted into a predetermined region at a predetermined depth of the first hetero semiconductor region 3 (i.e., peripheral region thereof contacted with the drain region 2 side) and into the drain region 2 at a predetermined depth (i.e., peripheral region thereof contacted with the first hetero semiconductor region 3) exemplarily by an ion implantation method in a state that the mask material 10 is unremoved. At this time, the mask material 10 is present on the gate electrode 5 in this example, so that no impurities reach the gate electrode 5.

Figure 38:
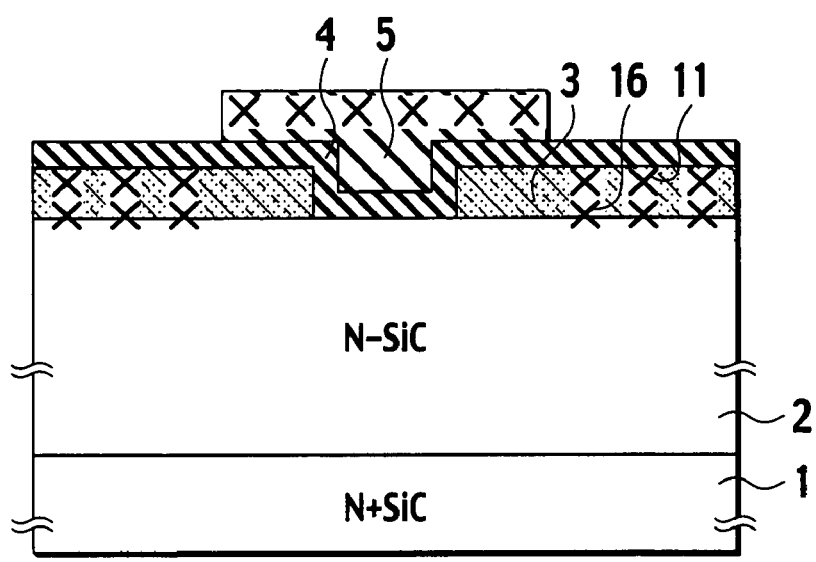
FIG. 38 is a cross-sectional view of an exemplary structure of an intermediate product in a sixth step of the process of manufacturing the semiconductor device according to the third embodiment of the present invention.

Further, as shown in a cross-sectional view of FIG. 38 in the sixth step (contact region forming step or low-resistance region forming step) and similarly to the third step in FIG. 30 as described above as the second embodiment, phosphorus or arsenic as impurity is implanted simultaneously into a predetermined region of the first hetero semiconductor region 3 (i.e., surface-layer portion thereof opposite to the drain region 2 side) and into the gate electrode 5 exemplarily by an ion implantation method, after removing the mask material 10. Although this embodiment is described for a situation that impurities are implanted into the surface-layer portion of the first hetero semiconductor region 3 through the gate insulator layer 4, it is possible to implant impurities after removing predetermined portions of the gate insulator layer 4 contacting with a portion of the first hetero semiconductor region into which the impurities are to be implanted. Note that it is not problematic to implant boron for P-type in a manner to include the surface-layer portion side of the first hetero semiconductor region 3, insofar as the impurity concentration of boron for P-type to be implanted into the predetermined region at the predetermined depth of the first hetero semiconductor region 3 (i.e., peripheral region thereof contacted with the drain region 2 side) is lower than the impurity concentration of phosphorus or arsenic to be implanted later for N$^+$-type, and insofar as the low-resistance region 6 can be formed in a later step.

Figure 39:
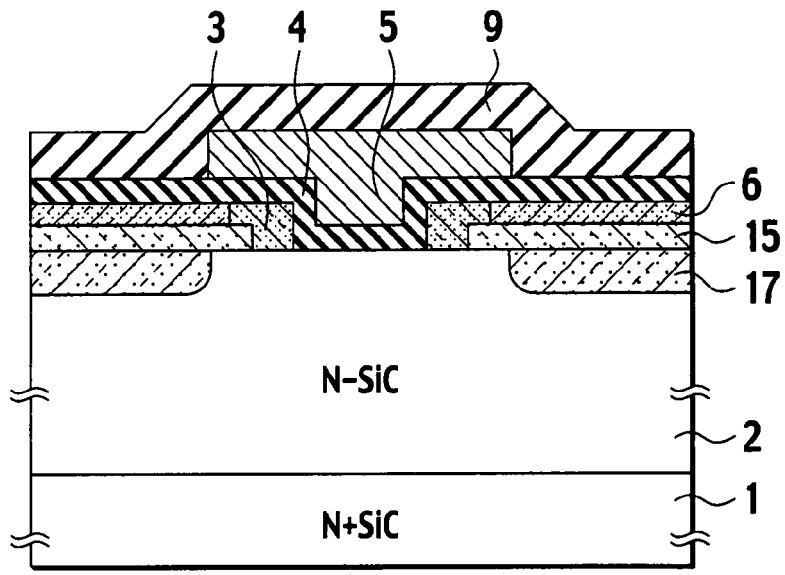
FIG. 39 is a cross-sectional view of an exemplary structure of an intermediate product in a seventh step of the process of manufacturing the semiconductor device according to the third embodiment of the present invention.

Then, as shown in a cross-sectional view of FIG. 39 in the seventh step (inter-layer insulator film forming step) and similarly to the fourth step of FIG. 31 as described above as the second embodiment, there is formed an inter-layer insulator film 9 made of a silicon oxide film such as formed by a CVD method on the gate insulator layer 4 and gate electrode 5, and the impurities implanted into the predetermined region of the drain region 2, into the predetermined regions of the first hetero semiconductor region 3, and into the gate electrode 5 in the fifth step of FIG. 37 and the sixth step of FIG. 38 are activated exemplarily by heat treatment, thereby forming a P$^+$-type second hetero semiconductor region 15, an N$^+$-type low-resistance region 6, an N$^+$-type gate electrode 5, and a first field limiting region 17, respectively.

Since it is possible here to readily control a diffusion depth of the low-resistance region 6 by controlling a temperature, time, and the like of the heat treatment, it is possible: to readily form the low-resistance region 6 in a manner to be also positioned just below and adjacent to the periphery of the gate electrode 5 through the gate insulator layer 4; and to readily form the first field limiting region 17 over a predetermined region at a desired impurity concentration.

Figure 40:
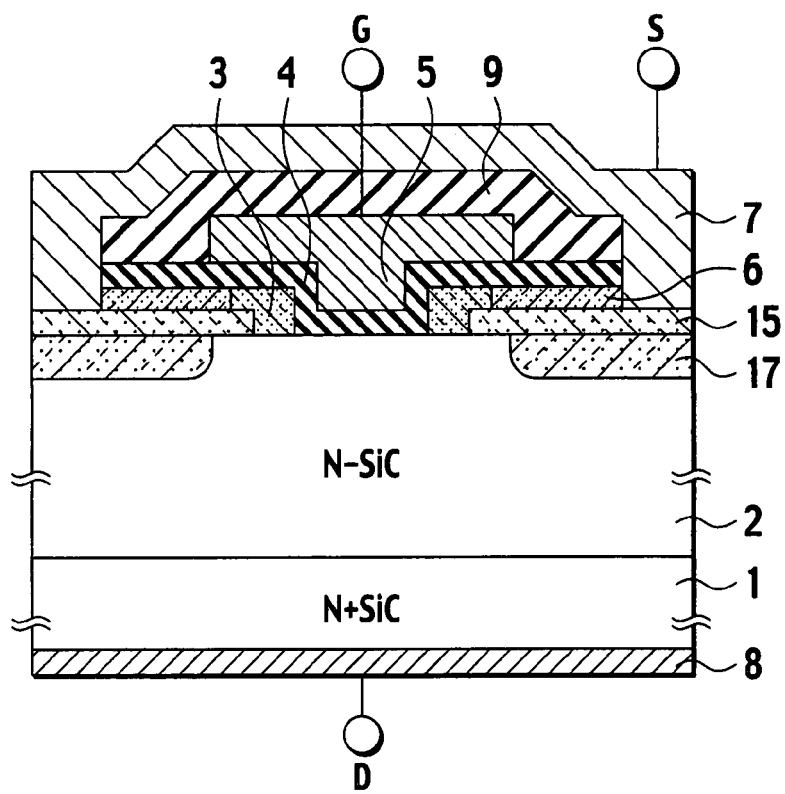
FIG. 40 is a cross-sectional view of an exemplary structure of an intermediate product in an eighth step of the process of manufacturing the semiconductor device according to the FIG. 41 is a cross-sectional view of a structure of a semiconductor device different from that of FIG. 35 according to the third embodiment of the present invention.

Thereafter, as shown in a cross-sectional view in the eighth step of FIG. 40 (drain electrode forming step, contact hole forming step, and source electrode forming step), the substrate region 1 corresponding to a reverse surface side of the semiconductor device is brought to be formed with a drain electrode 8 such as made of titanium (Ti) or nickel (Ni). Subsequently, there is used a predetermined mask material formed on the inter-layer insulator film 9, thereby selectively etching a predetermined etching region (peripheral region) of the inter-layer insulator film 9 such as by reactive ion etching (dry etching) to open a contact hole. Finally, the mask material is removed, followed by formation of a source electrode 7 by successively depositing titanium (Ti) and aluminum (Al) in a manner to connect to a side surface of the low-resistance region 6 and an upper surface of the second hetero semiconductor region 15 via contact hole, thereby completing the semiconductor device 400 according to the third embodiment of the present invention shown in FIG. 36.

Note that, as the manufacturing method where the field limiting region forming step is arranged to be later than the gate electrode forming step as described above in this embodiment, it is possible to utilize the gate electrode 5 itself or a mask material used to form the gate electrode 5, upon implanting impurities such as aluminum ions or boron ions so as to form the field limiting region 17. Alternatively, the field limiting region forming step may be arranged to be later than the contact hole forming step, in a manner that the mask material for contact hole formation used for patterning the inter-layer insulator film 9 is utilized to form the field limiting region 17.

As described above, the manufacturing method of manufacturing the semiconductor device 400 according to this embodiment can also be readily realized by the conventional manufacturing techniques, and can be simultaneously established by the simplified manufacturing process, as exemplified by the manufacturing method shown in FIG. 37 to FIG. 40. Note that, although not shown, the manufacturing method of manufacturing the semiconductor device 300 according to this embodiment can also be simplified in the same manner. Further, positional accuracy can also be enhanced by virtue of the self-alignment.

The configurations of the semiconductor device 300 in FIG. 35 and the semiconductor device 400 in FIG. 36, each cause a depletion layer to spread between the first field limiting region 17 and the drain region 2 commensurately with a drain potential in a non-conduction state. Namely, the drain field having been applied to the heterojunction interfaces between the first hetero semiconductor region 3 and second hetero semiconductor region 15 and the drain region 2 is limited by the first field limiting region 17 in a manner to further decrease leakage current, thereby enabling a certainty of non-conduction state to be further improved.

(Different Structural Example of Semiconductor Device in Third Embodiment)

Figure 41:
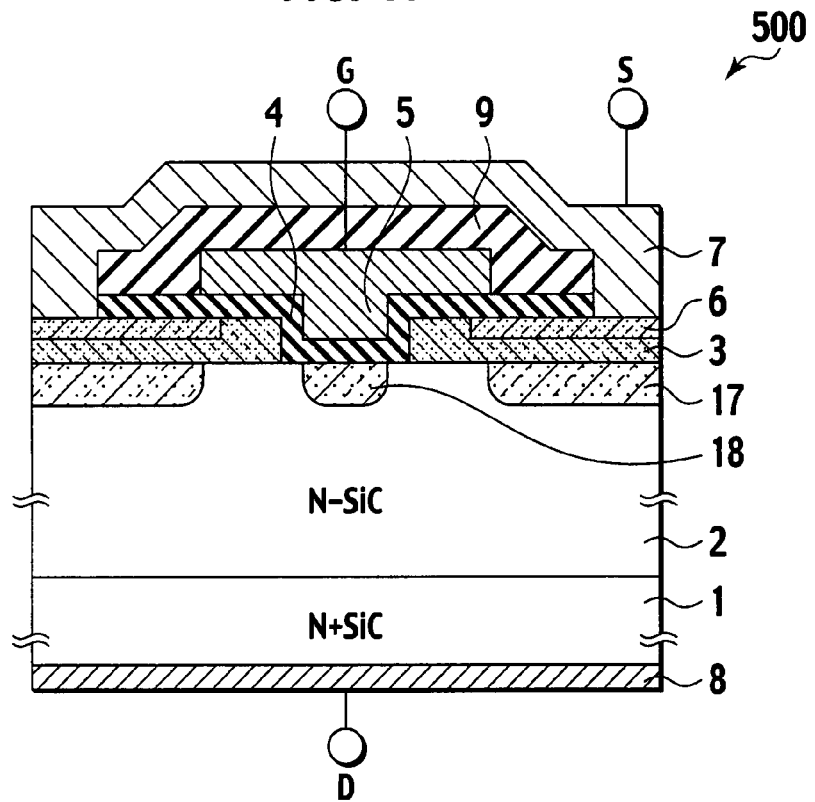
Figure 42:
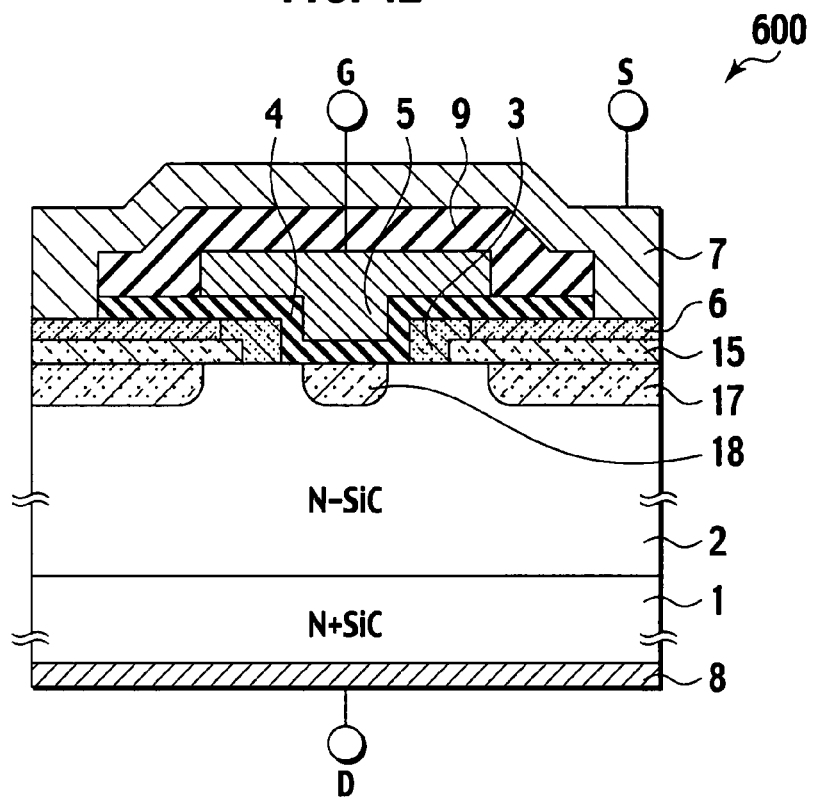
FIG. 42 is a cross-sectional view of a structure of a semiconductor device different from that of FIG. 36 according to the third embodiment of the present invention.

FIG. 41 is a cross-sectional view of a structure of a semiconductor device different from that of FIG. 35 according to the third embodiment of the present invention. FIG. 42 is a cross-sectional view of a structure of a semiconductor device different from that of FIG. 36 according to the third embodiment of the present invention. Here, the semiconductor device 500 of FIG. 41 corresponds to the semiconductor device 300 of FIG. 35, the semiconductor device 600 of FIG. 42 corresponds to the semiconductor device 400 of FIG. 36, and both the semiconductor devices exemplify configuration examples each further formed with a second field limiting region 18.

Namely, the semiconductor device 500 of FIG. 41 and the semiconductor device 600 of FIG. 42 are each configured so that the second field limiting region 18 is formed in the first main surface-layer portion of the drain region 2 at the center thereof in a manner to face toward and adjacently to the gate electrode 5 through the gate insulator layer 4, in addition to the configurations of the semiconductor device 300 of FIG. 35 and the semiconductor device 400 of FIG. 36, respectively. Similarly to the first field limiting region 17, the second field limiting region 18 may be formed of a P-type semiconductor region as a second electroconduction type different from the electroconduction type of the drain region 2 of the semiconductor substrate, or may be formed of a high-resistance region, insulator region, or the like.

Although the second field limiting region 18 is formed together with the first field limiting region 17 in the configuration of the semiconductor device 500 of FIG. 41 and the semiconductor device 600 of FIG. 42, the configuration of the second field limiting region 18 may be provided solely.

As field limiting regions in the first main surface-layer portion of the drain region 2 of the semiconductor substrate, the semiconductor device 500 of FIG. 41 and the semiconductor device 600 of FIG. 42 are each configured to form the first field limiting region 17 and second field limiting region 18, in at least a partial region (i.e., at least a partial region of the peripheral portion) of the surface-layer portion contacting with the first hetero semiconductor region 3 or second hetero semiconductor region 15, and/or, in at least a partial region (i.e., at least a partial region of the central portion) of the surface-layer portion faced toward the gate electrode 5 through the gate insulator layer 4. This causes a depletion layer to spread between the second field limiting region 18 and the drain region 2 commensurately with a drain potential in a non-conduction state in a manner to limit a drain field having been otherwise applied to the gate insulator layer 4, so that dielectric breakdown of the gate insulator layer 4 is scarcely caused, thereby improving reliability.

(Further Different Structural Example of Semiconductor Device in Third Embodiment)

Figure 43:
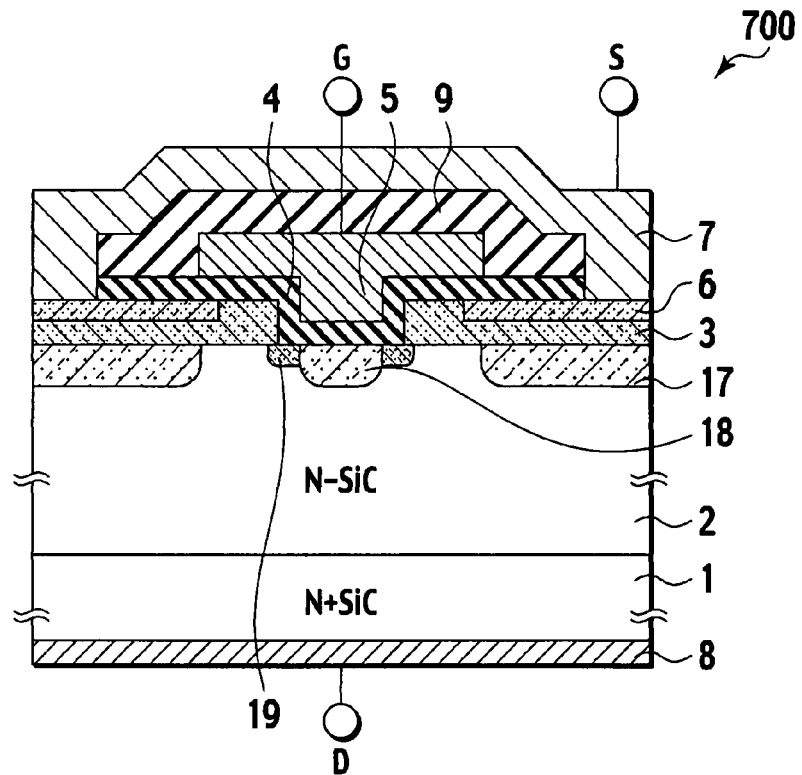
FIG. 43 is a cross-sectional view of a structure of a semiconductor device different from that of FIG. 41 according to the third embodiment of the present invention.
Figure 44:
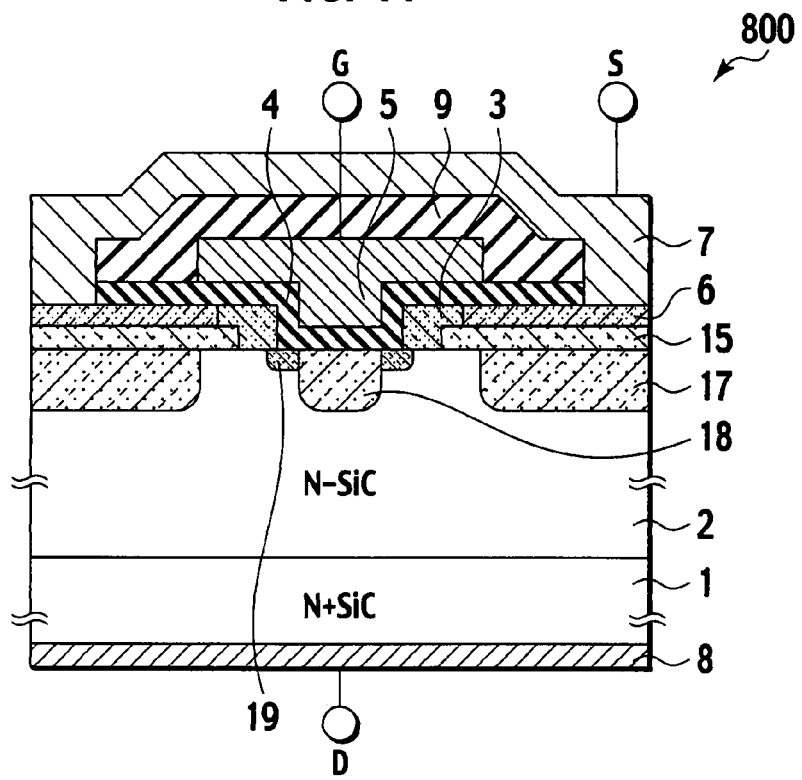
FIG. 44 is a cross-sectional view of a structure of a semiconductor device different from that of FIG. 42 according to the third embodiment of the present invention.

FIG. 43 is a cross-sectional view of a structure of a semiconductor device different from that of FIG. 41 according to the third embodiment of the present invention. Further, FIG. 44 is a cross-sectional view of a structure of a semiconductor device different from that of FIG. 42 according to the third embodiment of the present invention. Here, the semiconductor device 700 of FIG. 43 corresponds to the semiconductor device 500 of FIG. 41, the semiconductor device 800 of FIG. 44 corresponds to the semiconductor device 600 of FIG. 42, and both the semiconductor devices exemplify configuration examples each further formed with an electroconductive region 19.

Namely, the semiconductor device 700 of FIG. 43 and the semiconductor device 800 of FIG. 44 are each configured so that the electroconductive region 19 having a higher concentration than the drain region 2 and of the same N+ electroconduction type as the drain region 2 is formed along the surface-layer portion of the drain region 2 over a region extending: from the vicinity to the second field limiting region 18 formed in the predetermined region (i.e., first main surface-layer portion of the drain region 2 at the center thereof) of the drain region 2 contacted with the gate insulator layer 4 and first hetero semiconductor region 3; up to just below the peripheral portion of the first hetero semiconductor region 3; in addition to the configurations of the semiconductor device 500 of FIG. 41 and the semiconductor device 600 of FIG. 42, respectively. Although the electroconductive region 19 is formed together with the second field limiting region 18 and the first field limiting region 17 in each of the configurations of the semiconductor device 700 of FIG. 43 and the semiconductor device 800 of FIG. 44, the electroconductive region 19 may be provided solely, or may be provided together with either of the second field limiting region 18 or the first field limiting region 17.

According to the configurations of the semiconductor device 700 of FIG. 43 and the semiconductor device 800 of FIG. 44 in a manner to further possess an electroconductive region forming step where impurities at a concentration higher than that of the drain region 2 of the semiconductor substrate are implanted into a predetermined region (such as a region extending from the vicinity to the second field limiting region 18 at the central portion, along the surface-layer portion, up to just below the peripheral portion of the first hetero semiconductor region 3) of the surface-layer portion of the drain region 2 at its first main surface side, it becomes possible to limit an energy barrier of the heterojunction between the first hetero semiconductor region 3 and the electroconductive region 19 in a conduction state, thereby enabling obtainment of a higher conduction performance. Namely, the ON-resistance is further decreased, thereby enabling an improved conduction performance.

Although the semiconductor devices made of silicon carbide as a semiconductor substrate material have been exemplarily described in detail in all the embodiments, it is possible to adopt, as a semiconductor substrate material, other semiconductor materials such as silicon, silicon germanium, gallium nitride, and diamond. Further, although all the embodiments have been described by adopting 4H type as a polytype of silicon carbide, it is also possible to adopt other polytypes such as 6H (six-hexagonal), 3C (three-cubic), and the like. Moreover, all the embodiments have been described about a transistor of a so-called vertical-type structure where the drain electrode 8 and source electrode 7 are arranged to oppose to each other with the drain region 2 interposed therebetween, and the drain current is flowed in the vertical direction. However, it is also possible to exemplarily adopt a transistor of a so-called horizontal-type where the drain electrode 8 and the source electrode 7 are arranged in the same main surface in a manner to flow a drain current in a horizontal direction.

Furthermore, although the embodiments have been explained to exemplarily adopt polycrystalline silicon as a material for the first hetero semiconductor region 3 and the second hetero semiconductor region 15, it is also possible to adopt a material insofar as it forms a heterojunction with a semiconductor substrate, and examples of such a material include: other silicon materials such as single crystal silicon, amorphous silicon; other semiconductor materials such as germanium, silicon germanium, gallium arsenide, and the like; and other polytypes such as 6H, 3C, and the like.

Although the embodiments have been each described to exemplarily have a combination of an N-type silicon carbide as the drain region 2 and an N-type polycrystalline silicon as the first hetero semiconductor region 3, it is possible to adopt any desired combinations, such as a combination of N-type silicon carbide with P-type polycrystalline silicon, a combination of P-type silicon carbide with P-type polycrystalline silicon, and a combination of P-type silicon carbide with N-type polycrystalline silicon.

The contents of the Japanese Patent Application No. 2006-125117 are incorporated herein by reference.

While preferred embodiments of the present invention have been described using specific terms, such description is for illustrative purposes, and it is to be understood that changes and variations may be made without departing from the spirit or scope of the following claims.

The entire content of Japanese Patent Application No. TOKUGAN 2006-125117 with a filing date of Apr. 28, 2006 is hereby incorporated by reference.

What is claimed is:

1. A semiconductor device comprising:
   a substrate region;
   a drain region of a predetermined electroconduction type formed on the substrate region;
   a hetero semiconductor region contacted with a first main surface of the drain region and comprising a semiconductor material having a bandgap different from that of the drain region;
   a gate electrode formed through a gate insulator layer at a position adjacent to a junction region between the hetero semiconductor region and the drain region;
   a source electrode connected to the hetero semiconductor region; and
   a drain electrode connected to the drain region;
   wherein the hetero semiconductor region includes a contact portion contacted with the source electrode, at least a partial region of the contact portion is of the same electroconduction type as the electroconduction type of the drain region, and the partial region has an impurity concentration higher than an impurity concentration of at least a partial region of a gate-electrode facing portion in the hetero semiconductor region which is positioned to face toward the gate electrode through the gate insulator layer,
   the partial region of the gate-electrode facing portion has the same electroconduction type as the electroconduction type of the drain region.

2. The semiconductor device as claimed in claim 1, wherein at least part of that region of the hetero semiconductor region which is interposed between the gate -electrode facing portion and the contact portion, is of the same electroconduction type as that of the contact portion and forms an electroconductive portion having an impurity concentration higher than that of the gate-electrode facing portion in the hetero semiconductor region.

3. The semiconductor device as claimed in claim 2, wherein the electroconductive portion in the hetero semiconductor region is formed throughout a region positioned to extend from the contact portion up to just below a peripheral portion of the gate electrode.

4. The semiconductor device as claimed in claim 1, wherein at least a partial region of the contact portion contacted with the source electrode is contacted with the source electrode by that surface of the contact portion which is not parallel to the first main surface of the drain region.

5. The semiconductor device as claimed in claim 1, wherein at least a part of that region of the hetero semiconductor region which underlies the contact portion and which is contacted with the drain region, is of an electroconduction type different from the electroconduction type of the drain region.

6. The semiconductor device as claimed in claim 1, further comprising a plurality of regions including impurities implanted thereinto in a manner to be different from one another adjoining region by adjoining region in electroconduction type and/or impurity concentration, in at least a part of that region of the hetero semiconductor region which underlies the contact portion and which extends from the contact portion down to contact with the drain region.

7. The semiconductor device as claimed in claim 5, wherein at least the part of that region of the hetero semiconductor region which underlies the contact portion and which is contacted with the drain region, is contacted with the source electrode.

8. The semiconductor device as claimed in claim 1, further comprising a field limiting region, which is formed in a part of the first main surface side of the drain region, and which is configured to limit a drain field applied by the drain electrode to a junction region between the drain region and the hetero semiconductor region.

9. The semiconductor device as claimed in claim 8, wherein the field limiting region is formed of any one of: a semiconductor of an electroconduction type different from that of the drain region; a high-resistance element; and an insulator.

10. The semiconductor device as claimed in claim 8, wherein the field limiting region is formed in the first main surface side of the drain region; at a part of that region contacted with the hetero semiconductor region; and/or at a part of the region faced toward the gate electrode through the gate insulator layer.

11. The semiconductor device as claimed in claim 1, further comprising an electroconductive region formed at a part of the first main surface side of the drain region and having an impurity concentration higher than an impurity concentration of the drain region.

12. The semiconductor device as claimed in claim 1, wherein the gate electrode is an electroconduction type different from the electroconduction type of the drain region.

13. The semiconductor device as claimed in claim 1, further comprising a groove dug into the first main surface of the drain region whereby the gate electrode is arranged within the groove through the gate insulator layer.

14. The semiconductor device as claimed in claim 1, wherein the drain region is made of any one material of silicon carbide, gallium nitride, and diamond.

15. The semiconductor device as claimed in claim 1, wherein the hetero semiconductor region is made of any one material of single crystal silicon, polycrystalline silicon, amorphous silicon, germanium, silicon germanium, and gallium arsenide.

* * * * *